US012713860B2

(12) United States Patent
Sakamoto et al.

(10) Patent No.: US 12,713,860 B2
(45) Date of Patent: Aug. 18, 2026

(54) LASER PROCESSING METHOD

(71) Applicant: HAMAMATSU PHOTONICS K.K., Hamamatsu (JP)

(72) Inventors: Takeshi Sakamoto, Hamamatsu (JP); Junji Okuma, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 874 days.

(21) Appl. No.: 17/288,613

(22) PCT Filed: Oct. 30, 2019

(86) PCT No.: PCT/JP2019/042588
§ 371 (c)(1),
(2) Date: Apr. 26, 2021

(87) PCT Pub. No.: WO2020/090893
PCT Pub. Date: May 7, 2020

(65) Prior Publication Data

US 2021/0398856 A1 Dec. 23, 2021

(30) Foreign Application Priority Data

Oct. 30, 2018 (JP) ................................ 2018-204092

(51) Int. Cl.
*H10P 54/00* (2026.01)
*B23K 26/0622* (2014.01)
(Continued)

(52) U.S. Cl.
CPC .......... *H10P 54/00* (2026.01); *B23K 26/0622* (2015.10); *B23K 26/18* (2013.01); *B23K 26/53* (2015.10); *H10P 72/0428* (2026.01)

(58) Field of Classification Search
CPC .................................................. B23K 26/0622
See application file for complete search history.

(56) References Cited

U.S. PATENT DOCUMENTS 9,035,216 B2 * 5/2015 Sugiura .................. B23K 26/40 219/121.67
2003/0006221 A1 * 1/2003 Hong .................. H01L 21/3043 219/121.72

(Continued)

FOREIGN PATENT DOCUMENTS

CN 101057317 A 10/2007
CN 101516565 A 8/2009

(Continued)

OTHER PUBLICATIONS

JP-2013136075-A (Hoki Tetsuo) Jul. 11, 2013 [retrieved on Feb. 25, 2025]. Retrieved from Espacenet Database, translation by EPO and Google. (Year: 2013).*

(Continued)

*Primary Examiner* — Ibrahime A Abraham
*Assistant Examiner* — Franklin Jefferson Wang
(74) *Attorney, Agent, or Firm* — FAEGRE DRINKER BIDDLE & REATH LLP

(57) ABSTRACT

A laser processing method includes a laser light emitting step of emitting a pulsed laser light along a line from a back surface of a target having a functional element layer on side of a front surface. The laser light emitting step includes: a first step of irradiating the functional element layer with a first pulsed laser light along the line, to form a weakened region in the functional element layer along the line; and a second step of emitting a second pulsed laser light into the target to follow the first pulsed laser light along the line, to form a crack reaching the front surface along the line in the target. The first pulsed laser light has a pulse width that is shorter than a pulse width of the second pulsed laser light.

6 Claims, 12 Drawing Sheets

(51) Int. Cl.

| | |
|---|---|
| ***B23K 26/18*** | (2006.01) |
| ***B23K 26/53*** | (2014.01) |
| ***H10P 72/00*** | (2026.01) |

(56) References Cited

U.S. PATENT DOCUMENTS

| | | | | |
|---|---|---|---|---|
| 2004/0002199 | A1* | 1/2004 | Fukuyo | C03B 33/023 438/106 |
| 2005/0009301 | A1* | 1/2005 | Nagai | B23K 26/53 438/460 |
| 2007/0004179 | A1 | 1/2007 | Nakamura et al. | |
| 2010/0317172 | A1 | 12/2010 | Morikazu | |
| 2015/0217399 | A1* | 8/2015 | Tajikara | B23K 26/53 225/2 |
| 2016/0039044 | A1* | 2/2016 | Kawaguchi | B23K 26/40 219/121.69 |
| 2016/0158880 | A1* | 6/2016 | Koitzsch | H01L 21/78 264/400 |
| 2017/0084546 | A1* | 3/2017 | Cheong | H01L 21/78 |
| 2018/0151370 | A1* | 5/2018 | Bae | H01L 21/268 |
| 2018/0233410 | A1 | 8/2018 | James et al. | |
| 2020/0030917 | A1* | 1/2020 | Groninger | B23K 26/0622 |
| 2020/0061750 | A1* | 2/2020 | Eppelt | B23K 26/146 |

FOREIGN PATENT DOCUMENTS

| | | | | |
|---|---|---|---|---|
| JP | 2005-019667 | A | | 1/2005 |
| JP | 2006-140355 | A | | 6/2006 |
| JP | 2006-339382 | A | | 12/2006 |
| JP | 2007-012878 | A | | 1/2007 |
| JP | 2010-050175 | A | | 3/2010 |
| JP | 2010-284669 | A | | 12/2010 |
| JP | 2013136075 | A | * | 7/2013 |
| JP | 2013-219076 | A | | 10/2013 |
| JP | 5456510 | B2 | | 4/2014 |
| JP | 2014-120643 | A | | 6/2014 |
| JP | 2016-187014 | A | | 10/2016 |
| KR | 10-2009-0064510 | A | | 6/2009 |
| KR | 10-2011-0097621 | A | | 8/2011 |
| KR | 10-2014-0021824 | A | | 2/2014 |
| TW | I242792 | B | | 11/2005 |
| TW | I625777 | B | | 6/2018 |

OTHER PUBLICATIONS

International Preliminary Report on Patentability mailed May 14, 2021 for PCT/JP2019/042588.

* cited by examiner 61
64
66a
66
66b
10B
25
2
2a
12
21
22
23
26
14
L2
24
11
L1
10A
65b
65
63
65a
6
Z
Y
X 10A
L1
2
2a
12
13
25
65b
63(6)
61(6)
11
65(6)
21
22
18
28
27
28
28
27
28
17
24
14
L1
26
100
7

(a)

(b)

61
64
66a
66
66b
10B
25
2
2a
12
21
22
23
26
14
L2
24
11
3
L1
10A
65b
65
63
65a
6
81a
81(8)
Z
Y
X

LASER PROCESSING METHOD

TECHNICAL FIELD

One aspect of the present invention relates to a laser processing method.

BACKGROUND ART

As a technique related to a laser processing method, Patent Literature 1 describes a laser processing apparatus including a holding mechanism for holding a workpiece and a laser irradiation mechanism for irradiating the workpiece held by the holding mechanism with a laser light. In the laser processing apparatus described in Patent Literature 1, the laser irradiation mechanism including a condensing lens is fixed to a base, and the holding mechanism moves the workpiece in a direction orthogonal to the optical axis of the condensing lens.

CITATION LIST

Patent Literature

Patent Literature 1: Japanese Patent No. 5456510

SUMMARY OF INVENTION

Technical Problem

With the technique described above, when a target having a functional element layer on the front surface side is processed, crack reaching the front surface of the target (to be exposed) may be difficult to form, and thus the target may be difficult to cut accurately along the line.

One aspect of the present invention has been made in view of the above circumstances, and has an object to provide a laser processing method capable of accurately cutting a target.

Solution to Problem

A laser processing method according to one aspect of the present invention includes a laser light emitting step of emitting a puled laser light along a line from a back surface of a target having a functional element layer on side of a front surface. The laser light emitting step includes: a first step of irradiating the functional element layer with a first pulsed laser light along the line, to form a weakened region in the functional element layer along the line; and a second step of emitting a second pulsed laser light into the target to follow the first pulsed laser light along the line, to form a crack reaching the front surface along the line in the target. The first pulsed laser light has a pulse width that is shorter than a pulse width of the second pulsed laser light.

In this laser processing method, by irradiating the functional element layer with the first pulsed laser light, the functional element layer can be weakened and a weakened region can be formed in the functional element layer. Therefore, by emitting the second pulsed laser light after the emission of the first pulsed laser light, a crack reaching the surface of the target on the functional element layer side (hereinafter, also referred to as "half cut") can be reliably formed along the line by using the weakened region. The target can be cut accurately.

In the laser processing method according to one aspect of the present invention, a pulse pitch of the first pulsed laser light may be shorter than a pulse pitch of the second pulsed laser light. In this case, by irradiating the functional element layer with the first pulsed laser light, the weakened region can be reliably formed in the functional element layer.

In the laser processing method according to one aspect of the present invention, the functional element layer may include at least one of a protective film, a low dielectric constant film, and a metal layer. In this case, since it is particularly difficult to form a half cut on the surface on the functional element layer side, the above-mentioned action and effect capable of reliably forming the half cut are particularly effective.

In the laser processing method according to one aspect of the present invention, in the first step, a focusing position of the first pulsed laser light may be a position that is separated from the functional element layer on an opposite side of an incident side of the pulsed laser light, a position in the target, or a position in the functional element layer. In this case, by irradiating the functional element layer with the first pulsed laser light, the weakened region can be reliably formed in the functional element layer.

In the laser processing method according to one aspect of the present invention, a protective tape or a protective substrate may be attached to the front surface of the target. The protective tape or the protective substrate can protect the functional element layer on the surface side of the target and can suppress scattering of processing by-products that may be generated when the weakened region is formed in the functional element layer.

In the laser processing method according to one aspect of the present invention, in the first step, the first laser processing head may move along the line while emitting the first pulsed laser light, and in the second step, the second laser processing head may move along the line to follow the first laser processing head while emitting the second pulsed laser light. In this case, it is possible to efficiently achieve the formation of the weakened region and the formation of the half cut using the weakened region.

A laser processing method according to one aspect of the present invention includes a laser light emitting step of emitting a puled laser light along a line from a back surface of a target having a functional element layer on side of a front surface. The laser light emitting step includes: a first step of irradiating the functional element layer with a first pulsed laser light along the line, to form a weakened region in the functional element layer along the line; and a second step of emitting a second pulsed laser light into the target to follow the first pulsed laser light along the line. The first pulsed laser light has a pulse width that is shorter than a pulse width of the second pulsed laser light.

Also in this laser processing method, by irradiating the functional element layer with the first pulsed laser light, the functional element layer can be weakened and a weakened region can be formed in the functional element layer. Therefore, by emitting the second pulsed laser light, it is possible to accurately cut the target along the line by using the weakened region.

Advantageous Effects of Invention

According to one aspect of the present invention, a laser processing method capable of accurately cutting a target can be provided.

BRIEF DESCRIPTION OF DRAWINGS

FIG. 6(*b*) is a side sectional view of the target continuing from FIG. 6(*a*).

FIG. 8(*b*) is a side sectional view of the target continuing from FIG. 8(*a*). FIG. 8(*c*) is a side sectional view of the target continuing from FIG. 8(*ba*).

FIG. 9(*b*) is a side sectional view of a target illustrating still another example of the focusing position of the first laser light.

DESCRIPTION OF EMBODIMENTS

Hereinafter, embodiments will be described in detail with reference to the drawings. The same elements in the figures will be denoted by the same reference signs, and overlapping descriptions will be omitted.

[Configuration of Laser Processing Apparatus]

Figure 1:
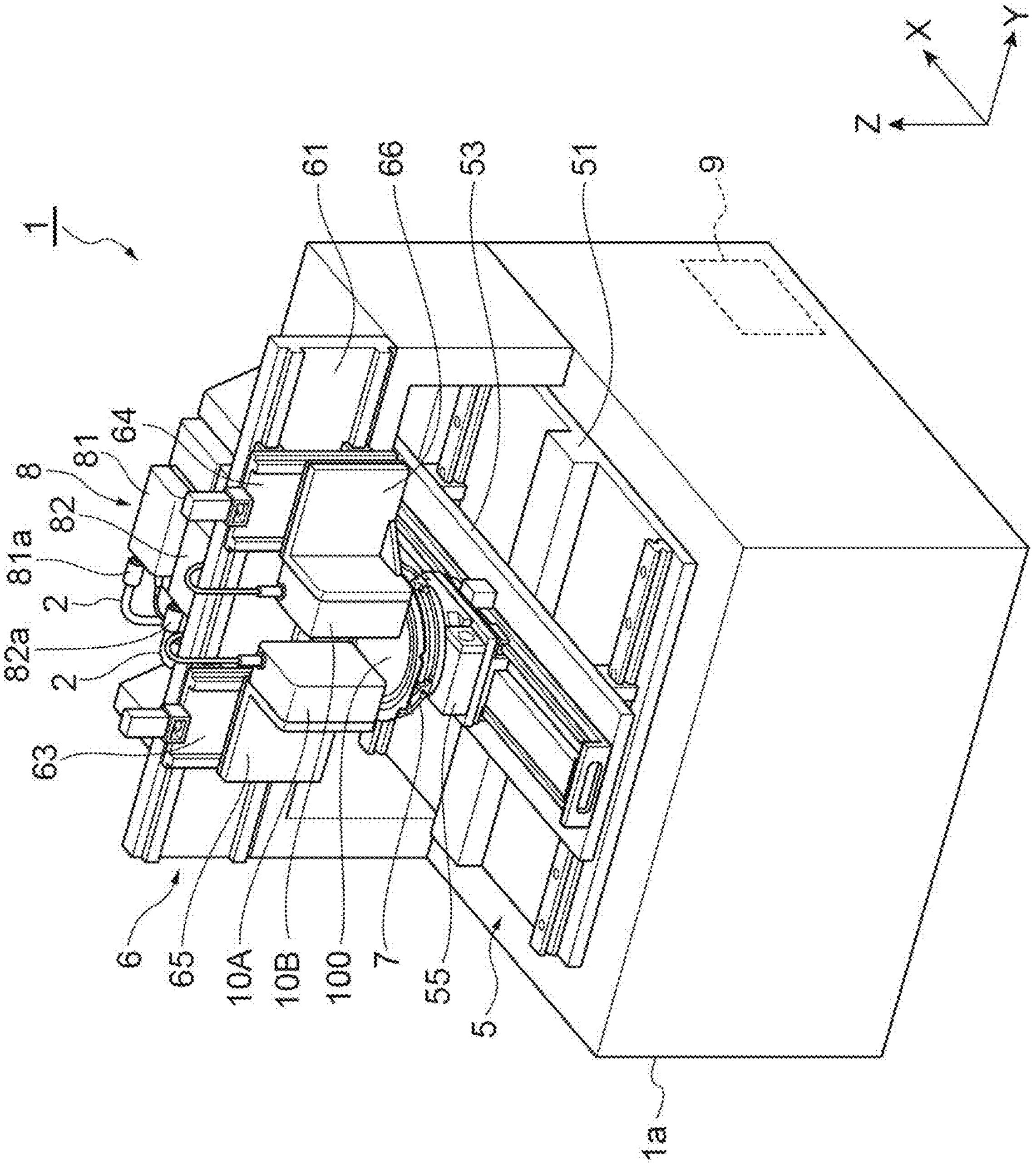
FIG. 1 is a perspective view of a laser processing apparatus of an embodiment.

As illustrated in FIG. 1, a laser processing apparatus 1 performs a laser processing method according to the embodiment. The laser processing apparatus 1 includes a plurality of movement mechanisms 5 and 6, a support portion 7, a pair of laser processing heads 10A and 10B (a first laser processing head and a second laser processing head), a light source unit 8, and a controller 9. Hereinafter, a first direction is referred to as an X direction, a second direction orthogonal to the first direction is referred to as a Y direction, and a third direction orthogonal to the first direction and the second direction is referred to as a Z direction. In the present embodiment, the X direction and the Y direction are horizontal directions, and the Z direction is a vertical direction.

The movement mechanism 5 includes a fixed portion 51, a moving portion 53, and an attachment portion 55. The fixed portion 51 is attached to a device frame 1*a*. The moving portion 53 is attached to a rail provided on the fixed portion 51, and can move along the Y direction. The attachment portion 55 is attached to a rail provided on the moving portion 53, and can move along the X direction.

The movement mechanism 6 includes a fixed portion 61, a pair of moving portions (a first moving portion and a second moving portion) 63 and 64, and a pair of attachment portions (a first attachment portion and a second attachment portion) 65 and 66. The fixed portion 61 is attached to the device frame 1*a*. The pair of moving portions 63 and 64 are each attached to a rail provided on the fixed portion 61, and can each independently move along the Y direction. The attachment portion 65 is attached to a rail provided on the moving portion 63, and can move along the Z direction. The attachment portion 66 is attached to a rail provided on the moving portion 64, and can move along the Z direction. Thus, the pair of attachment portions 65 and 66 can respectively move along the Y direction and the Z direction relative to the device frame 1*a*.

The support portion 7 is attached to a rotation shaft provided to the attachment portion 55 of the movement mechanism 5, and can rotate about an axis parallel to the Z direction. Thus, the support portion 7 can move along each of the X direction and the Y direction, and can rotate about the axis parallel to the Z direction. The support portion 7 supports a target 100. The target 100 is, for example, a wafer.

Figure 2:
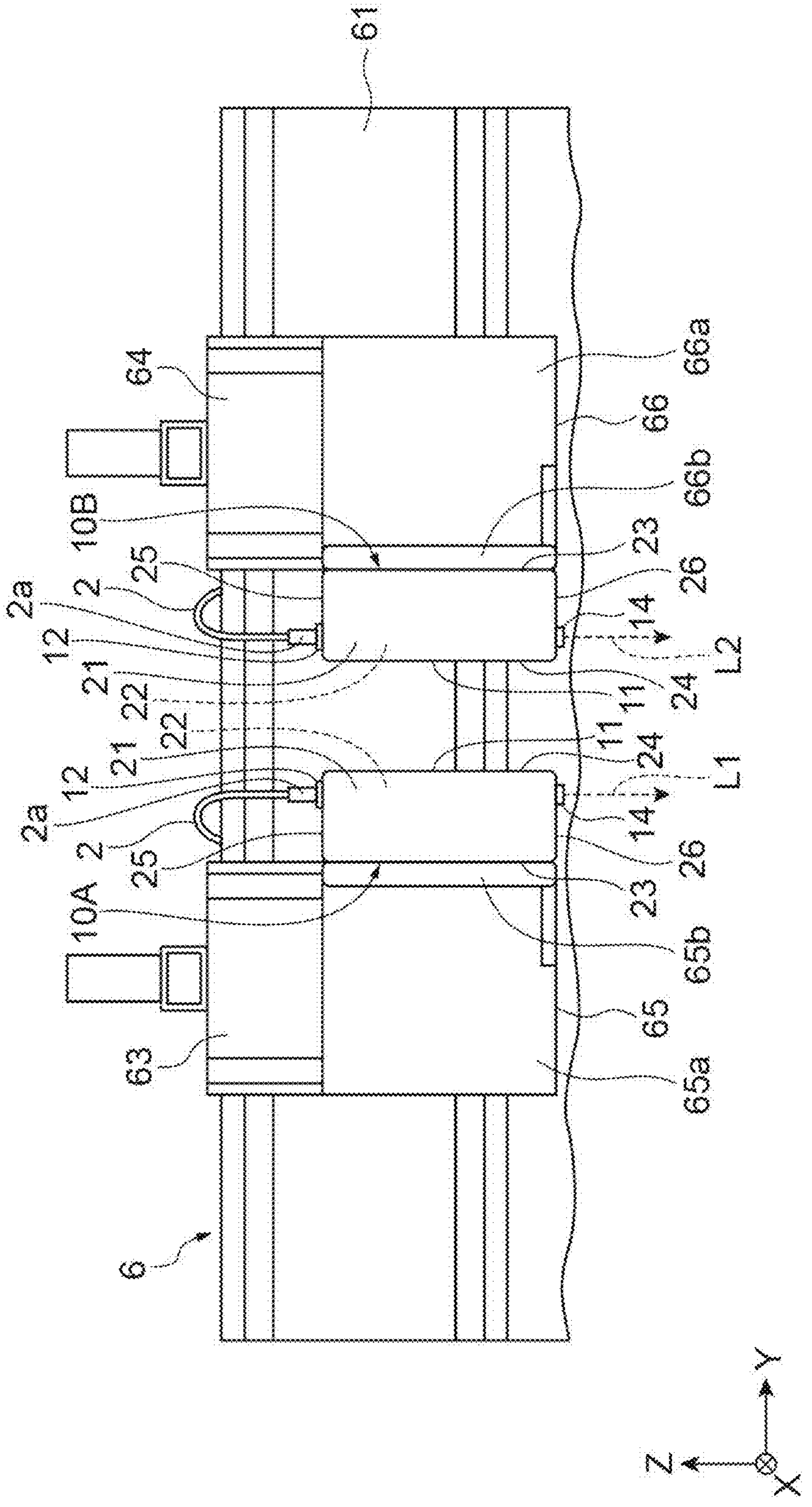
FIG. 2 is a front view of a portion of the laser processing apparatus illustrated in FIG. 1.

As illustrated in FIGS. 1 and 2, the laser processing head 10A is attached to the attachment portion 65 of the movement mechanism 6. The laser processing head 10A irradiates the target 100, supported by the support portion 7, with a laser light L1 (also referred to as "first laser light L1"), while facing the support portion 7 in the Z direction. The laser processing head 10B is attached to the attachment portion 66 of the movement mechanism 6. The laser processing head 10B irradiates the target 100, supported by the support portion 7, with a laser light L2 (also referred to as "second laser light L2"), while facing the support portion 7 in the Z direction.

The light source unit 8 includes a pair of light sources 81 and 82. The light source 81 outputs the laser light L1. The laser light L1 is emitted from an emission portion 81*a* of the light source 81, and is guided to the laser processing head 10A by an optical fiber 2. The light source 82 outputs the laser light L2. The laser light L2 is emitted from an emission portion 82*a* of the light source 82, and is guided to the laser processing head 10B by another optical fiber 2.

The controller 9 controls each part of the laser processing apparatus 1 (such as the plurality of movement mechanisms 5 and 6, the pair of laser processing heads 10A and 10B, and the light source unit 8). The controller 9 is configured as a computer device including a processor, a memory, a storage, a communication device, and the like. In the controller 9, software (program) loaded onto the memory or the like is performed by the processor, and reading and writing of data from and to the memory and storage, and communication by the communication device are controlled by the processor. Thus, the controller 9 implements various functions.

An example of processing by the laser processing apparatus 1 configured as described above will be described. This example processing is an example in which a modified region is formed inside the target 100 along each of a plurality of lines set to form a grid pattern for cutting the target 100, which is a wafer, into a plurality of chips.

First of all, the movement mechanism 5 moves the support portion 7, supporting the target 100, along each of the X direction and the Y direction to make the support portion 7 face the pair of laser processing heads 10A and 10B in the Z direction. Then, the movement mechanism 5 rotates the support portion 7 about the axis parallel to the Z direction to align the plurality of lines extending in one direction on the target 100 with the X direction.

Subsequently, the movement mechanism 6 moves the laser processing head 10A along the Y direction to position the focusing point of the laser light L1 on one line extending in one direction. Furthermore, the movement mechanism 6 moves the laser processing head 10B along the Y direction to position the focusing point of the laser light L2 on another one of the lines extending in one direction. Then, the movement mechanism 6 moves the laser processing head 10A along the Z direction to position the focusing point of the laser light L1 inside the target 100. Furthermore, the movement mechanism 6 moves the laser processing head 10B along the Z direction to position the focusing point of the laser light L2 inside the target 100.

Then, the light source 81 outputs the laser light L1 and the laser processing head 10A irradiates the target 100 with the laser light L1, whereas the light source 82 outputs the laser light L2 and the laser processing head 10B irradiates the target 100 with the laser light L2. At the same time, the movement mechanism 5 moves the support portion 7 along the X direction to relatively move the focusing point of the laser light L1 along one line extending in one direction, and to relatively move the focusing point of the laser light L2 along another line extending in one direction. In this manner, the laser processing apparatus 1 forms the modified region inside the target 100 along each of the plurality of lines extending in one direction on the target 100.

Subsequently, the movement mechanism 5 rotates the support portion 7 about an axis parallel to the Z direction so that a plurality of lines extending in the other direction orthogonal to one direction of the target 100 are aligned with the X direction.

Subsequently, the movement mechanism 6 moves the laser processing head 10A along the Y direction to position the focusing point of the laser light L1 on one line extending in the other direction. On the other hand, the movement mechanism 6 moves the laser processing head 10B along the Y direction to position the focusing point of the laser light L2 on another line extending in the other direction. Then, the movement mechanism 6 moves the laser processing head 10A along the Z direction to position the focusing point of the laser light L1 inside the target 100. Furthermore, the movement mechanism 6 moves the laser processing head 10B along the Z direction to position the focusing point of the laser light L2 inside the target 100.

Then, the light source 81 outputs the laser light L1 and the laser processing head 10A irradiates the target 100 with the laser light L1, whereas the light source 82 outputs the laser light L2 and the laser processing head 10B irradiates the target 100 with the laser light L2. At the same time, the movement mechanism 5 moves the support portion 7 along the X direction to relatively move the focusing point of the laser light L1 along one extending in the other direction, and to relatively move the focusing point of the laser light L2 along another line extending in the other direction. In this manner, the laser processing apparatus 1 forms the modified region inside the target 100 along each of the plurality of lines extending in the other direction on the target 100 orthogonal to the one direction.

In one example processing described above, the light source 81 outputs the laser light L1 that transmits through the target 100 by pulse oscillation, and the light source 82 outputs the laser light L2 that transmits through the target 100 by pulse oscillation. When such laser lights are focused inside the target 100, the laser lights are mainly absorbed at the portion corresponding to the focusing points of the laser lights, whereby the modified region is formed inside the target 100. The modified region is a region in which the density, refractive index, mechanical strength, and other physical characteristics are different from those of the surrounding non-modified regions. Examples of the modified region include a melting treatment region, a crack region, a dielectric breakdown region, a refractive index change region, and the like.

When the target 100 is irradiated with the laser light output using the pulse oscillation and the focusing point of the laser light is relatively moved along the line set on the target 100, a plurality of modified spots are formed in an aligned manner along the line. One modified spot is formed by irradiation with one pulse laser light. A line of modified region is a collection of a plurality of modified spots aligned. Adjacent modified spots may be connected to each other or separated from each other depending on the relative moving speed of the focusing point of the laser light with respect to the target 100 and the repetition frequency of the laser light.

[Configuration of Laser Processing Head]

Figure 3:
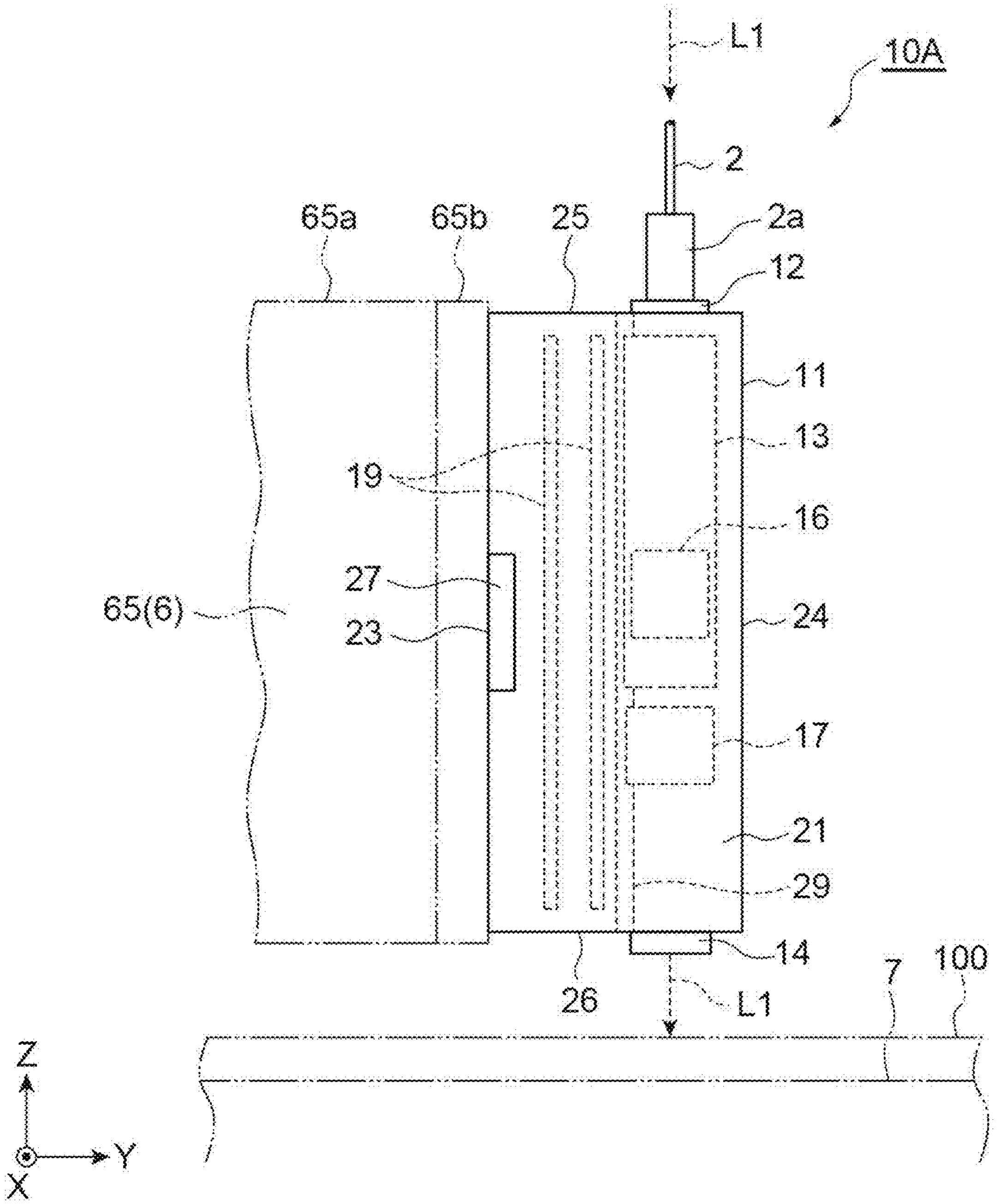
FIG. 3 is a front view of a laser processing head of the laser processing apparatus illustrated in FIG. 1.
Figure 4:
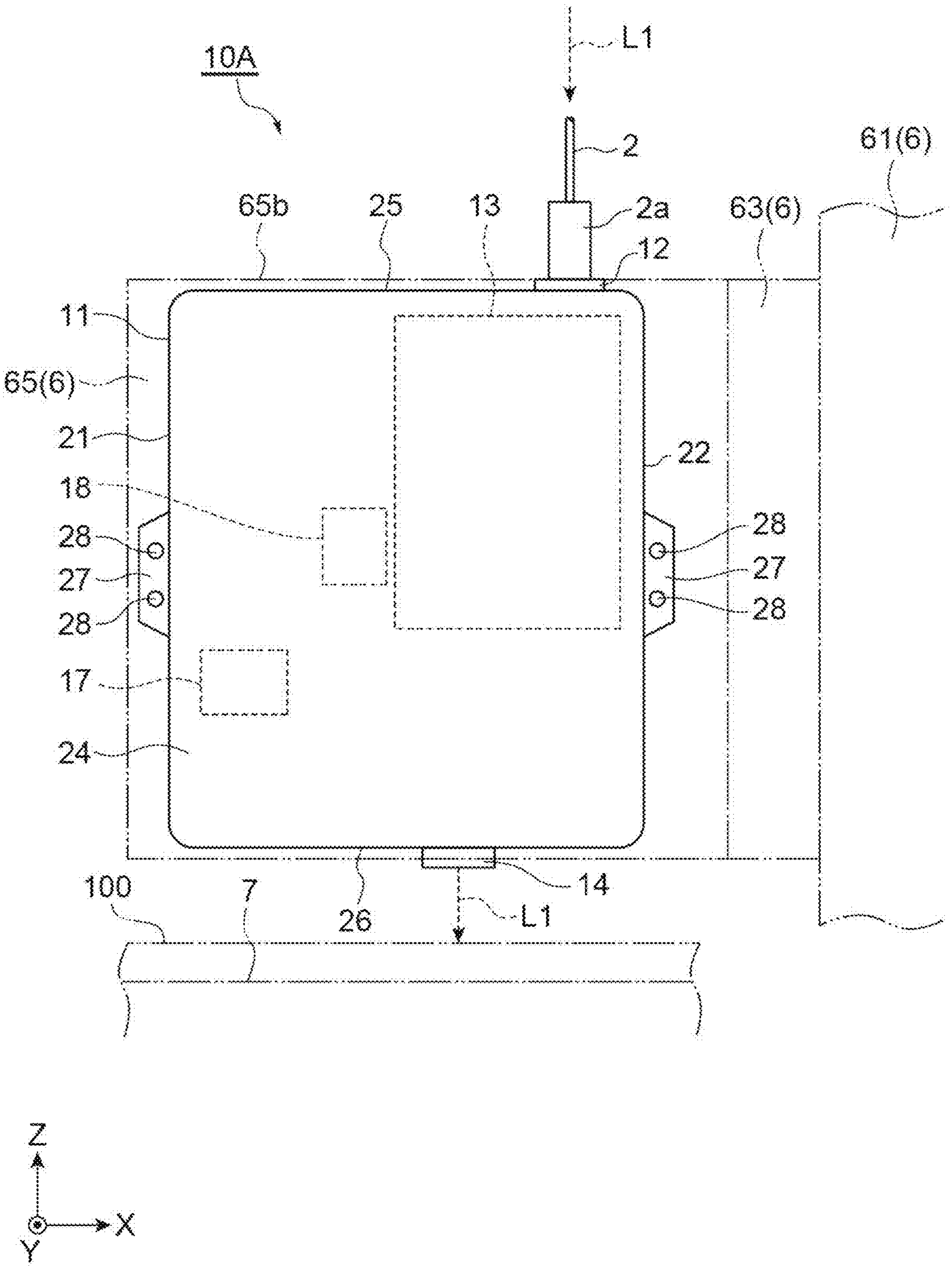
FIG. 4 is a side view of the laser processing head illustrated in FIG. 3.

As illustrated in FIGS. 3 and 4, the laser processing head 10A includes a housing 11, an entrance portion 12, an adjustment unit 13, and a condensing unit 14.

The housing 11 has a first wall portion 21, a second wall portion 22, a third wall portion 23, a fourth wall portion 24, a fifth wall portion 25, and a sixth wall portion 26. The first wall portion 21 and the second wall portion 22 face each other in the X direction. The third wall portion 23 and the fourth wall portion 24 face each other in the Y direction. The fifth wall portion 25 and the sixth wall portion 26 face each other in the Z direction.

The distance between the third wall portion 23 and the fourth wall portion 24 is shorter than the distance between the first wall portion 21 and the second wall portion 22. The distance between the first wall portion 21 and the second wall portion 22 is shorter than the distance between the fifth wall portion 25 and the sixth wall portion 26. The distance between the first wall portion 21 and the second wall portion 22 may the same as the distance between the fifth wall portion 25 and the sixth wall portion 26, or may be longer than the distance between the fifth wall portion 25 and the sixth wall portion 26.

In the laser processing head 10A, the first wall portion 21 is located on the fixed portion 61 side of the movement mechanism 6, and the second wall portion 22 is located on side opposite to the fixed portion 61. The third wall portion 23 is located on the attachment portion 65 side of the movement mechanism 6, and the fourth wall portion 24 is located on the side opposite to the attachment portion 65 which is the laser processing head 10B side (see FIG. 2). The fifth wall portion 25 is located on the side opposite to the support portion 7, and the sixth wall portion 26 is located on the support portion 7 side.

The housing 11 is configured to be attached to the attachment portion 65, with the third wall portion 23 arranged on the attachment portion 65 side of the movement mechanism 6. The specific configuration is as follows. The attachment portion 65 includes a base plate 65*a* and an attachment plate 65*b*. The base plate 65*a* is attached to a rail provided on the moving portion 63 (see FIG. 2). The attachment plate 65*b* stands at an end portion of the base plate 65*a* on the laser processing head 10B side (see FIG. 2). The housing 11 is attached to the attachment portion 65 by screwing bolts 28 to the attachment plate 65*b* via supports 27 in a state where the third wall portion 23 is in contact with the attachment plate 65*b*. The supports 27 are respectively provided to the first wall portion 21 and the second wall portion 22. The housing 11 is detachably attached to the attachment portion 65.

The entrance portion 12 is attached to the fifth wall portion 25. The laser light L1 enters the housing 11 through the entrance portion 12. The entrance portion 12 is offset toward the second wall portion 22 side (one wall portion side) in the X direction, and is offset toward the fourth wall portion 24 side in the Y direction. Specifically, the distance between the entrance portion 12 and the second wall portion 22 in the X direction is shorter than the distance between the entrance portion 12 and the first wall portion 21 in the X direction, and the distance between the entrance portion 12 and the fourth wall portion 24 in the Y direction is shorter than the distance between the entrance portion 12 and the third wall portion 23 in the X direction.

The entrance portion 12 is configured to be connectable with a connection end portion 2*a* of the optical fiber 2. The connection end portion 2*a* of the optical fiber 2 is provided with a collimator lens that collimates the laser light L1 emitted from an emission end of the fiber, but is not provided with an isolator that suppresses the return light. The isolator is provided at an intermediate portion of the fiber more on the light source 81 side than the connection end portion 2*a*. This leads to downsizing of the connection end portion 2*a*, and of the entrance portion 12. The isolator may be provided at the connection end portion 2*a* of the optical fiber 2.

The adjustment unit 13 is arranged in the housing 11. The adjustment unit 13 adjusts the laser light L1 entered through the entrance portion 12. Each configuration of the adjustment unit 13 is attached to an optical base 29 provided in the housing 11. The optical base 29 is attached to the housing 11 so as to partition the area inside the housing 11 into a region on the third wall portion 23 side and a region on the fourth wall portion 24 side. The optical base 29 is integrated with the housing 11. The configurations of the adjustment unit 13 are attached to the optical base 29 on the fourth wall portion 24 side, and will be described in detail later.

The condensing unit 14 is arranged in the sixth wall portion 26. Specifically, the condensing unit 14 is arranged in the sixth wall portion 26 while being inserted into a hole 26*a* formed in the sixth wall portion 26. The condensing unit 14 condenses the laser light L1 adjusted by the adjustment unit 13 and emits it to the outside of the housing 11. The condensing unit 14 is offset toward the second wall portion 22 (one wall portion side) in the X direction, and is offset toward the fourth wall portion 24 in the Y direction. Specifically, the distance between the condensing unit 14 and the second wall portion 22 in the X direction is shorter than the distance between the condensing unit 14 and the first wall portion 21 in the X direction, and the distance between the condensing unit 14 and the fourth wall portion 24 in the Y direction is shorter than the distance between the condensing unit 14 and the third wall portion 23 in the X direction.

Figure 5:
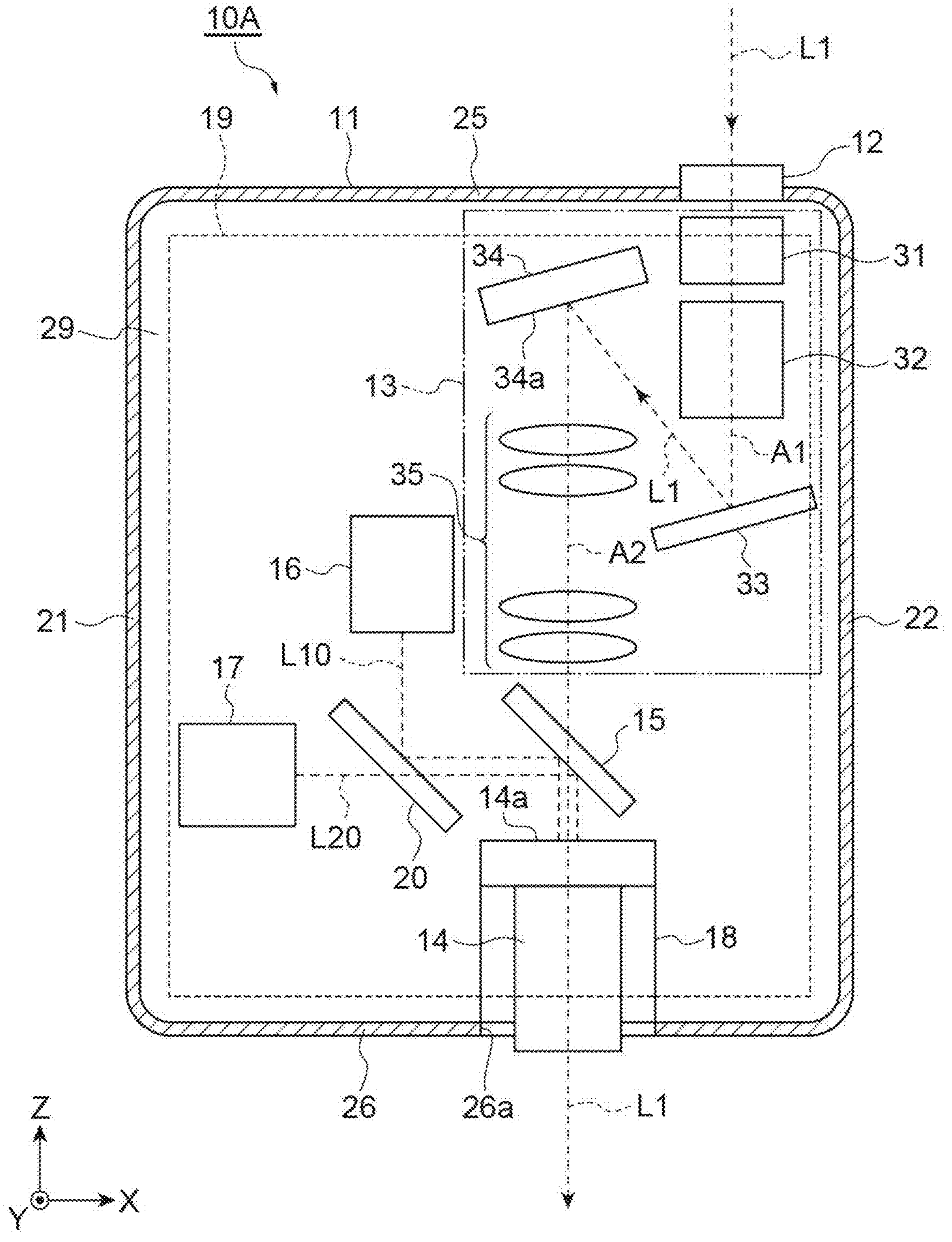
FIG. 5 is a diagram illustrating a configuration of an optical system of the laser processing head illustrated in FIG. 3.

As illustrated in FIG. 5, the adjustment unit 13 includes an attenuator 31, a beam expander 32, and a mirror 33. The entrance portion 12, as well as the attenuator 31, the beam expander 32, and the mirror 33 of the adjustment unit 13 are arranged on a straight line (first straight line) A1 extending along the Z direction. The attenuator 31 and the beam expander 32 are arranged between the entrance portion 12 and the mirror 33 on the straight line A1. The attenuator 31 adjusts the output of the laser light L1 that has entered through the entrance portion 12. The beam expander 32 expands the diameter of the laser light L1 the output of which has been adjusted by the attenuator 31. The mirror 33 reflects the laser light L1 the diameter of which has been expanded by the beam expander 32.

The adjustment unit 13 further includes a reflective spatial light modulator 34 and an imaging optical system 35. The reflective spatial light modulator 34 and the imaging optical system 35 of the adjustment unit 13 as well as the condensing unit 14 are arranged on a straight line (second straight line) A2 extending along the Z direction. The reflective spatial light modulator 34 modulates the laser light L1 reflected by the mirror 33. The reflective spatial light modulator 34 is, for example, a spatial light modulator (SLM) of a reflective liquid crystal (Liquid Crystal on Silicon (LCOS)). The imaging optical system 35 serves as a bilateral telecentric optical system in which a reflecting surface 34*a* of the reflective spatial light modulator 34 and an entrance pupil surface 14*a* of the condensing unit 14 are in an imaging relationship. The imaging optical system 35 includes three or more lenses.

The straight line A1 and the straight line A2 are located on a plane orthogonal to the Y direction. The straight line A1 is located on the second wall portion 22 side (one wall portion side) with respect to the straight line A2. In the laser processing head 10A, the laser light L1 enters the housing 11 through the entrance portion 12, travels on the straight line A1, is sequentially reflected by the mirror 33 and the reflective spatial light modulator 34, and then travels on the straight line A2 to be emitted to the outside of the housing 11 through the condensing unit 14. The order of arrangement of the attenuator 31 and the beam expander 32 may be reversed. The attenuator 31 may be arranged between the mirror 33 and the reflective spatial light modulator 34. The adjustment unit 13 may further include other optical components (for example, a steering mirror arranged in front of the beam expander 32 or the like).

The laser processing head 10A further includes a dichroic mirror 15, a measurement unit 16, a monitoring unit 17, a driving unit 18, and a circuit unit 19.

The dichroic mirror 15 is arranged between the imaging optical system 35 and the condensing unit 14 on the straight line A2. That is, the dichroic mirror 15 is arranged between the adjustment unit 13 and the condensing unit 14 in the housing 11. The dichroic mirror 15 is attached to the optical base 29 on the fourth wall portion 24 side. The dichroic mirror 15 transmits the laser light L1. From the sake of suppressing astigmatism, the dichroic mirror 15 is preferably of, for example, a cube type or a two-plate type arranged in a twisted relationship.

The measurement unit 16 is arranged in the housing 11 on the first wall portion 21 side (opposite to one wall portion side) with respect to the adjustment unit 13. The measurement unit 16 is attached to the optical base 29 on the fourth wall portion 24 side. The measurement unit 16 outputs measurement light L10 for measuring the distance between the surface of the target 100 (for example, the surface on the side where the laser light L1 is incident) and the condensing unit 14, and detects the measurement light L10 reflected by the surface of the target 100 via the condensing unit 14. Thus, the surface of the target 100 is irradiated with the measurement light L10 output from the measurement unit 16, via the condensing unit 14, and then, the measurement light L10 reflected by the surface of the target 100 is detected by the measurement unit 16 via the condensing unit 14.

More specifically, the measurement light L10 output from the measurement unit 16 is sequentially reflected by a beam splitter 20 and the dichroic mirror 15 attached to the optical base 29 on the fourth wall portion 24 side, and then is emitted to the outside of the housing 11 from the condensing unit 14. The measurement light L10 reflected on the surface of the target 100 enters the housing 11 from the condensing unit 14 and is sequentially reflected by the dichroic mirror 15 and the beam splitter 20, to be incident on and detected by the measurement unit 16.

The monitoring unit 17 is arranged in the housing 11 on the first wall portion 21 side (opposite to one wall portion side) with respect to the adjustment unit 13. The monitoring unit 17 is attached to the optical base 29 on the fourth wall portion 24 side. The monitoring unit 17 outputs monitoring light L20 for monitoring the surface of the target 100 (for example, the surface on the side where the laser light L1 is incident), and detects the monitoring light L20 reflected by the surface of the target 100, via the condensing unit 14. Thus, the surface of the target 100 is irradiated with the monitoring light L20 output from the monitoring unit 17, via the condensing unit 14, and then, the monitoring light L20 reflected by the surface of the target 100 is detected by the monitoring unit 17 via the condensing unit 14.

More specifically, the monitoring light L20 output from the monitoring unit 17 transmits through the beam splitter 20 and is reflected by the dichroic mirror 15, to be emitted to the outside of the housing 11 from the condensing unit 14. The monitoring light L20 reflected by the surface of the target 100 enters the housing 11 through the condensing unit 14, and is reflected by the dichroic mirror 15 to be transmitted through the beam splitter 20 and to be incident on and detected by the monitoring unit 17. Wavelengths of the laser light L1, the measurement light L10, and the monitoring light L20 are different from each other (at least their center wavelengths are shifted from each other).

The driving unit 18 is attached to the optical base 29 on the fourth wall portion 24 side. It is attached to the sixth wall portion 26 of the housing 11. The driving unit 18 moves the condensing unit 14, arranged on the sixth wall portion 26, along the Z direction using, for example, driving force of a piezoelectric element.

The circuit unit 19 is arranged on the third wall portion 23 side with respect to the optical base 29, in the housing 11. Specifically, in the housing 11, the circuit unit 19 is arranged on the third wall portion 23 side with respect to the adjustment unit 13, the measurement unit 16, and the monitoring unit 17. The circuit unit 19 is, for example, a plurality of circuit boards. The circuit unit 19 processes a signal output from the measurement unit 16 and a signal input to the reflective spatial light modulator 34. The circuit unit 19 controls the driving unit 18 based on the signal output from the measurement unit 16. As an example, the circuit unit 19 controls the driving unit 18 to maintain a constant distance between the surface of the target 100 and the condensing unit 14 (to maintain a constant distance between the surface of the target 100 and the focusing point of the laser light L1) based on the signal output from the measurement unit 16. The housing 11 is provided with a connector (not illustrated) to which wiring for electrically connecting the circuit unit 19 to the controller 9 (see FIG. 1) or the like is connected.

Similar to the laser processing head 10A, the laser processing head 10B includes the housing 11, the entrance portion 12, the adjustment unit 13, the condensing unit 14, the dichroic mirror 15, the measurement unit 16, the monitoring unit 17, the driving unit 18, and the circuit unit 19. Note that, as illustrated in FIG. 2, the configurations of the laser processing head 10B are in a plane-symmetrical relationship with the configurations of the laser processing head 10A, about a virtual plane that passes through the midpoint between the pair of attachment portions 65 and 66 and is orthogonal to the Y direction.

For example, the housing (first housing) 11 of the laser processing head 10A is attached to the attachment portion 65 with the fourth wall portion 24 positioned on the laser processing head 10B side with respect to the third wall portion 23, and with the sixth wall portion 26 positioned on the support portion 7 side with respect to the fifth wall portion 25. On the other hand, the housing (second housing) 11 of the laser processing head 10B is attached to the attachment portion 66 with the fourth wall portion 24 positioned on the laser processing head 10A side with respect to the third wall portion 23, and with the sixth wall portion 26 positioned on the support portion 7 side with respect to the fifth wall portion 25.

The housing 11 of the laser processing head 10B is configured to be attached to the attachment portion 66 with the third wall portion 23 arranged on the attachment portion 66 side. The specific configuration is as follows. The attachment portion 66 includes a base plate 66*a* and an attachment plate 66*b*. The base plate 66*a* is attached to a rail provided on the moving portion 63. The attachment plate 66*b* stands at an end portion of the base plate 66*a* on the laser processing head 10A side. The housing 11 of the laser processing head 10B is attached to the attachment portion 66 with the third wall portion 23 being in contact with the attachment plate 66*b*. The housing 11 of the laser processing head 10B is detachably attached to the attachment portion 66.

Figure 6:
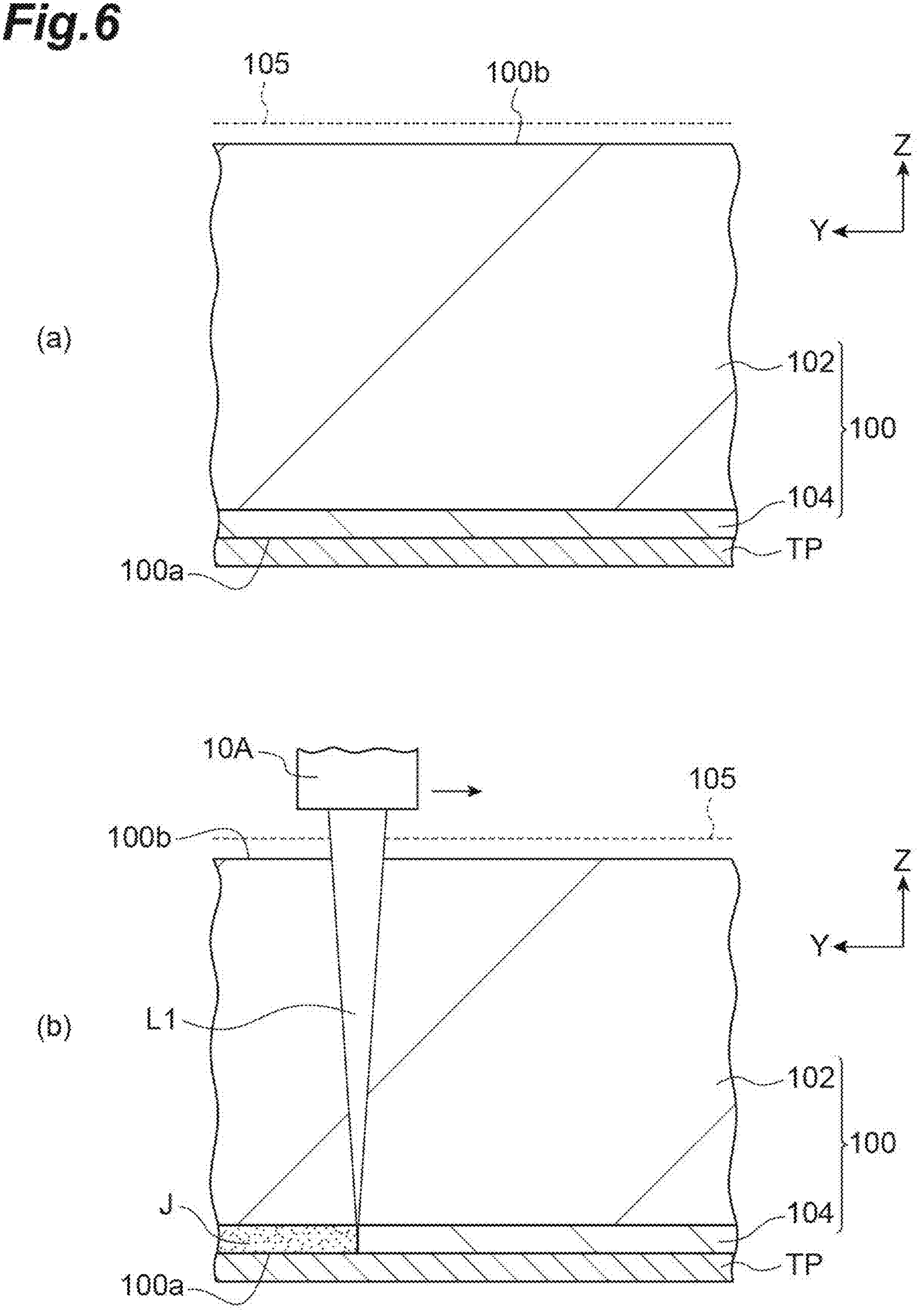
FIG. 6(*a*) is a side sectional view of a target for explaining an example of laser processing performed by the laser processing apparatus illustrated in FIG. 1.
Figure 7:
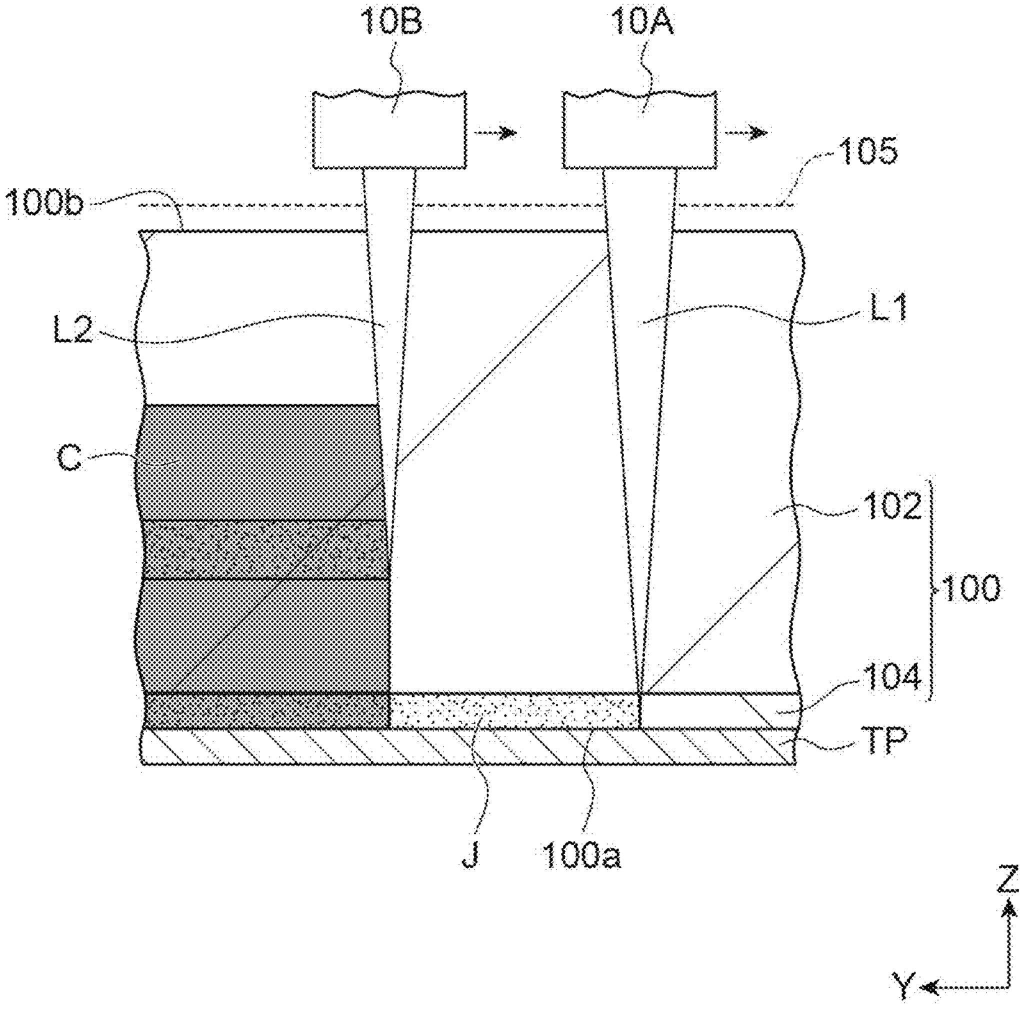
FIG. 7 is a side sectional view of the target continuing from FIG. 6(*b*).

As illustrated in FIG. 6(*a*), FIG. 6(*b*), and FIG. 7, the controller 9 of the present embodiment controls emission of the first and the second laser lights L1 and L2 from the first and the second laser processing heads 10A and 10B, and movement of the first and the second focusing points of the first and the second laser lights L1 and L2.

The controller 9 performs a laser light emitting process of irradiating the target 100 with a laser light, which is a pulsed laser light, along a plurality of lines 105 from a back surface 100*b*. The target 100 includes a substrate 102 and a functional element layer 104. The functional element layer 104 is arranged on a front surface 100*a* side of the target 100. Specifically, the target 100 has the functional element layer 104 provided on the substrate 102. The surface of the substrate 102 opposite to the functional element layer 104 side serves as the back surface 100*b* of the target 100. The surface of the functional element layer 104 on the opposite side of the substrate 102 serves as the front surface 100*a* of the target 100.

The plurality of lines 105 each pass through adjacent ones of a plurality of functional elements included in the functional element layer 104 as viewed in the thickness direction of the target 100. The plurality of functional elements are arranged in a matrix form, and the plurality of lines 105 are set to be in a grid form, as viewed in the thickness direction of the target 100. The lines 105 are virtual lines, but may be lines actually drawn.

The laser light emitting process includes a first process of irradiating the functional element layer 104 with the first laser light L1 as a first pulsed laser light along the line 105, to form a weakened region J in the functional element layer 104 along the line 105. The weakened region J is a region in which the functional element layer 10 is weakened. Weakened include making embrittled.

Weakening includes embrittling. The weakening of the functional element layer 10 means thermal damage such as melting and evaporation due to absorption of the first laser light L1 and a change in chemical bond due to the laser irradiation, as well as a result of non-thermal processing such as cutting or ablation processing and the like, in at least a partial region of the functional element layer 10 (such as a part of the functional element layer 10 and at least one layer of a plurality of layers forming the functional element layer 10 for example). The weakening of the functional element layer 10 refers to a state as a result of the above where the weakened region can be easily cut or broken compared with an unprocessed region (unweakened region) in response to application of stress such as bending stress or tensile stress on the functional element layer 10. The weakened region (embrittled region) J can be regarded as a region bruised due to the laser irradiation, and is a region that is easily cut or broken compared with the unprocessed region. The weakened region J may be continuously formed in a line form or may be intermittently formed in accordance with a pulse pitch of the laser irradiation, in at least a partial region of the functional element layer 10.

The laser light emitting process includes a second process performed while the weakened region J is formed along the line 105 in the first process, to emit the second laser light L2 as a second pulsed laser light into the target 100 to follow the first laser light L1 so that a crack C reaching the front surface 100*a* is formed in the target 100 along the line 105. "The second laser light L2 follows the first laser light L1" means that the second laser light L2 advances after the first laser light L1, and that the second laser light L2 does not pass the first laser light L1. "The second laser light L2 follows the first laser light L1" a part or the entirety of the line 105 that has been scanned by the first laser light L1 (scanning) is scanned by the second laser light L2. "The second laser light L2 follows the first laser light L1" means that as long as the second laser light L2 advances after the first laser light L1, the emitted timings of the first and the second laser lights L1 and L2 may or may not overlap.

The controller 9 sets the pulse width of the first laser light L1 to be shorter than the pulse width of the second laser light L2 in the laser light emitting process. The controller 9 sets the pulse pitch of the first laser light L1 to be shorter than the pulse pitch of the second laser light L2 in the laser light emitting process. In the first process, the controller 9 sets the focusing position of the first laser light L1 to be a position separated from the functional element layer 104 toward the opposite side of the laser light incident side, a position in the substrate 102 of the target 100, or a position in the functional element layer 104.

In the first process, the controller 9 makes the first laser processing head 10A emit the first laser light L1 while moving along the line 105. In the second process, the controller 9 makes the second laser processing head 10B emit the second laser light L2 while moving along the line 105 to follow the first laser processing head 10A.

[Laser Processing Method]

An example of laser processing (laser processing method) performed by the laser processing apparatus 1 will be described below.

As illustrated in FIG. 6(*a*), the protective tape TP is attached to the front surface 100*a* of the target 100. A protective substrate may be attached to the front surface 100*a* instead of the protective tape TP. The target 100 is placed on the support portion 7 (see FIG. 1) with its back surface 100*b* positioned on the upper side. Subsequently, the target 100 is irradiated with the first and the second laser lights L1 and L2 from the back surface 100*b* along the line 105 (laser light emitting step).

As illustrated in FIG. 6(*b*), in the laser light emitting step, the functional element layer 104 is irradiated with the first laser light L1 from the first laser processing head 10A along the line 105. At the same time, the first laser processing head 10A moves in the Y direction along the line 105. As a result, the weakened region J is formed in the functional element layer 104 along the line 105 (first step).

Furthermore, as illustrated in FIG. 7, in the laser light emitting step, the functional element layer 104 is irradiated with the first laser light L1 from the first laser processing head 10A and with the second laser light L2 from the second laser processing head 10B along the line 105, in a concurrent and parallel manner. At the same time, the second laser processing head 10B moves in the Y direction along the line 105 to follow the first laser processing head 10A. Thus, the second laser light L1 is emitted in the target 100 to follow the first laser light L1 along the line 105, while the weakened region J is being formed in the first step. As a result, the crack C reaching the front surface 100*a* is formed in the target 100 along the line 105 (second step). In the example illustrated in FIG. 7, the crack C extends in a direction parallel to the paper sheet and exists in a translucent and shaded area.

In the laser light emitting step, the pulse width of the first laser light L1 in the first step is shorter than the pulse width of the second laser light L2 in the second step. In the laser light emitting step, the pulse pitch of the first laser light L1 in the first step is shorter than the pulse pitch of the second laser light L2 in the second step.

Next, the above-mentioned laser light emitting step will be described in detail with reference to FIGS. 8 and 9.

Figure 8:
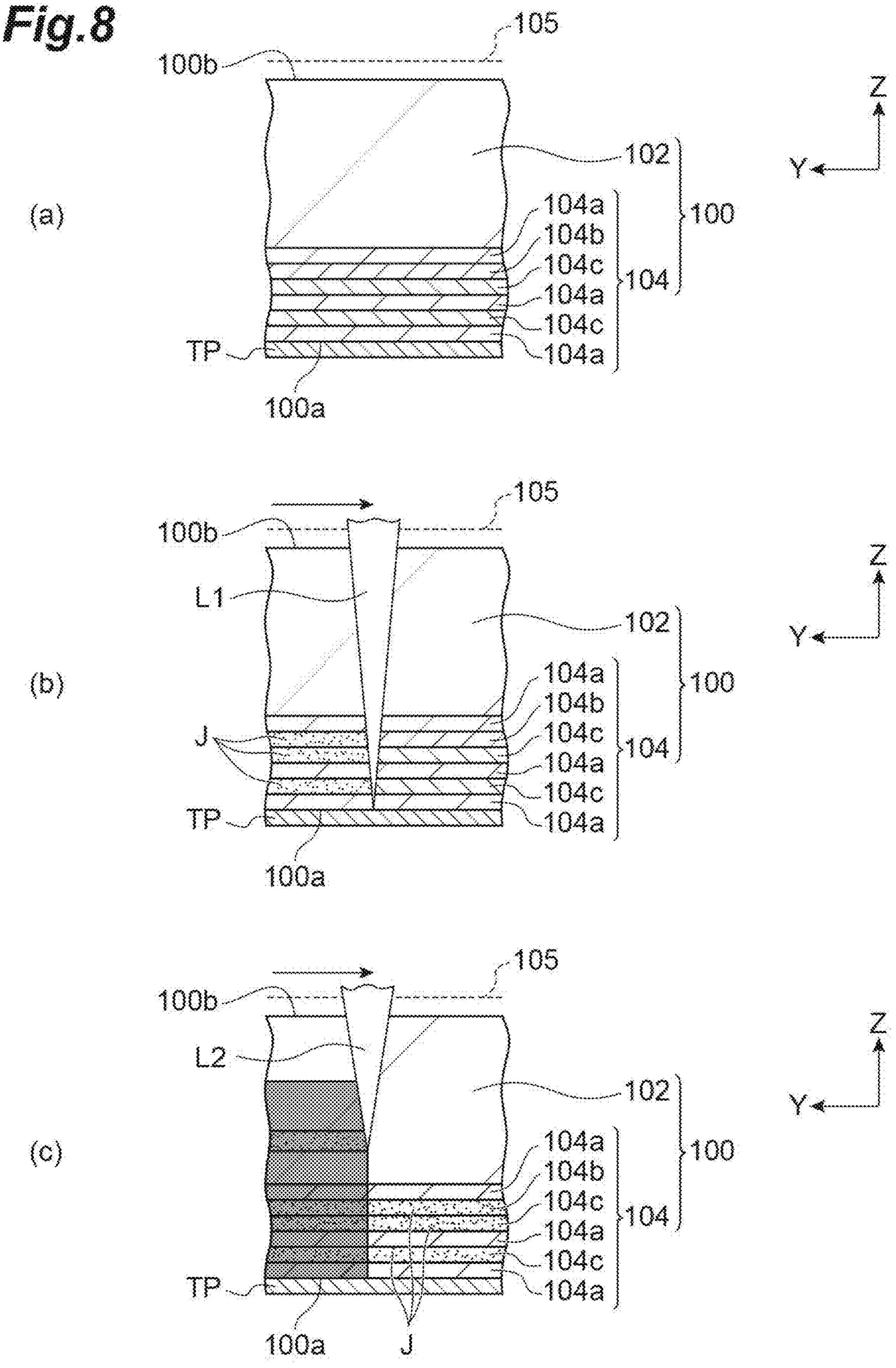
FIG. 8(*a*) is a side sectional view of the target for explaining details of a laser light emitting step.
Figure 9:
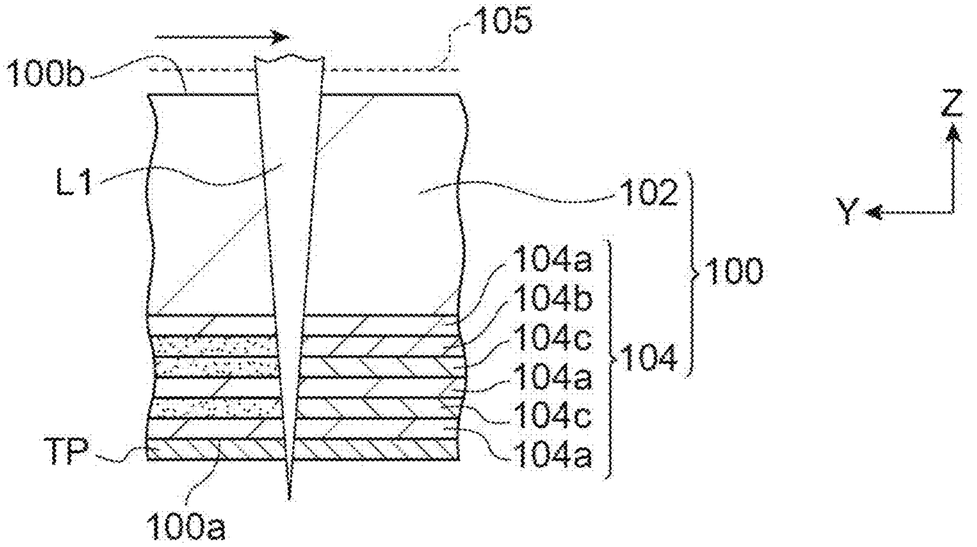
FIG. 9(*a*) is a side sectional view of a target illustrating another example of a focusing position of a first laser light.
Figure 9:
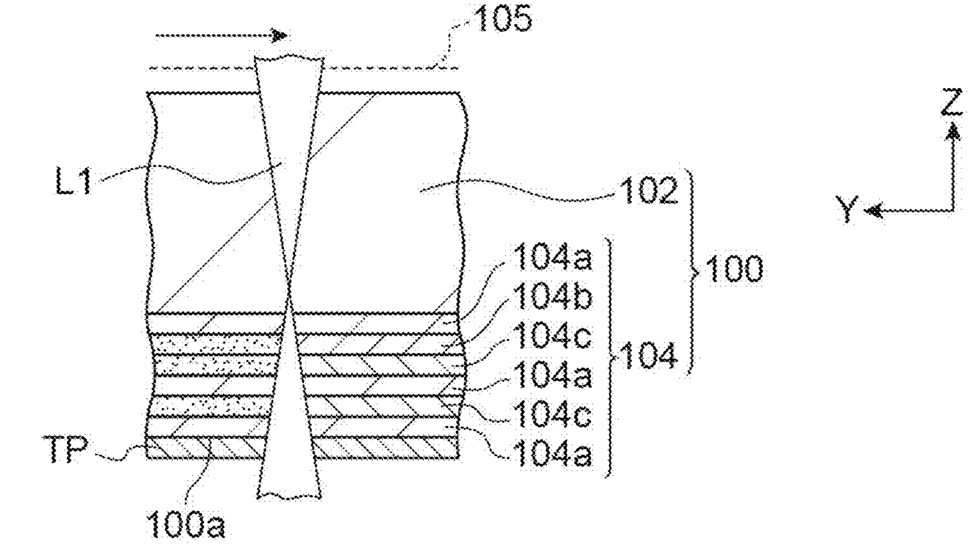

The target 100 illustrated in FIG. 8(*a*) includes the substrate 102 which is a silicon wafer and the functional element layer 104 that has a laminated structure and is provided on the substrate 102. The functional element layer 104 includes a protective film 104*a*, a low dielectric constant film 104*b*, and a metal layer 104*c*. The protective film 104*a* is, for example, a silicon dioxide ($SiO_2$) film. The low dielectric constant film 104*b* is a film formed of a Low-k material. The metal layer 104*c* is a layer including Test Element Group (TEG) or metal wiring. In the illustrated example, the functional element layer 104 includes the protective film 104*a*, the metal layer 104*c*, the protective film 104*a*, the metal layer 104*c*, the low dielectric constant film 104*b*, and the protective film 104*a* in this order from the front surface 100*a* toward the back surface 100*b*. The protective tape TP is attached to the front surface 100*a* of the target 100.

In the laser light emitting step, the first and the second laser lights L1 and L2 are emitted along each of the plurality of lines 105, and the target 100 is cut for each functional element included in the functional element layer 104. Specifically, first of all, as illustrated in FIG. 8(*b*), in a state where the protective tape is attached to the front surface 100*a*, the focusing point of the first laser light L1 is set to be within the functional element layer 104, and the target 100 is irradiated with the first laser light L1 from the back surface 100*b*. Thus, the target 100 is irradiated with the first laser light L1 with the back surface 100*b* serving as the laser light incident surface, and the focusing position of this first laser light L1 is set to be a position inside the functional element layer 104. The wavelength of the first laser light L1 is, for example, 1064 nm to 1550 nm. The first laser light L1 is an ultrashort pulse, and the pulse width of the first laser light L1 is, for example, 100 fsec to 20 psec. The pulse pitch of the first laser light L1 is 0.1 μm to 3 μm.

With the pulse of the first laser light L1 further emitted on to the target 100 (functional element layer 104) with a certain amount of heat or more remaining, the functional element layer 104 can be efficiently weakened. For example, the functional element layer 104 can be efficiently weakened, with the first laser light L1 emitted in a hurst oscillation mode (oscillation of pulses of a predetermined amount or a in a predetermined period of time, also referred to as burst pulse). As an example of the burst pulse of the first laser light L1, five pulses may be emitted with a pulse width of 20 psec and at a pulse pitch of 3 μm.

The first laser light L1 (first laser processing head 10A) moves along the line 105, while the first laser light L1 is being emitted. As a result, the weakened region J is formed in the functional element layer 104 along the line 105. In the present embodiment, the first laser light L1 is more absorbed in the low dielectric constant film 104*b* and the metal layer 104*c* than in the protective film 104*a*, and thus the low dielectric constant film 104*b* and the metal layer 104*c* are weakened, whereby the weakened region J is formed in the low dielectric constant film 104*b* and the metal layer 104*c* (first step).

Next, while the weakened region J is being formed, as illustrated in FIG. 8(*c*), the target 100 is irradiated with the second laser light L1 from the back surface 100*b* with the focusing point of the second laser light L2 set in the substrate 102. The wavelength of the second laser light L2 is, for example, 1064 nm to 1550 nm. The pulse width of the second laser light L2 is, for example, 150 nsec to 1000 nsec. The pulse pitch of the second laser light L2 is 3.75 μm to 10 μm.

The second laser light L2 (second laser processing head 10B) moves along the line 105, while the second laser light L2 is being emitted to follow the first laser light L1. As a result, a modified region (not illustrated) is formed inside the substrate 102 along the line 105, and the crack C is generated from the modified region.

With the second laser light L2 emitted, the crack C easily advances in the protective film 104*a*, but may be difficult to advance in the low dielectric constant film 104*b* and the metal layer 104*c* due to an influence of adhesion or the like. In view of this, in the present embodiment, the low dielectric constant film 104*b* and the metal layer 104*c* are weakened to include the weakened region J, in which the crack C easily advances due to the irradiation of the second laser light L2. Thus, the crack C advances in the protective film 104*a* and in the low dielectric constant film 104*b* and the metal layer 104*c* including the weakened region J, to reach the front surface 100*a* (second step).

In the present embodiment, the focusing position of the first laser light L1 for forming the weakened region J is in the functional element layer 104, but this should not be construed in a limiting sense. The focusing position of the first laser light L1 may be any position in the target 100. Alternatively, as illustrated in FIG. 9(*a*), the focusing position of the first laser light L1 may be a position separated from the functional element layer 104 toward the opposite side of the first laser light L1 incident side (a position deeper than the functional element layer 104, a position outside the target 100 and beyond the functional element layer 104 and the protective tape TP). Alternatively, as illustrated in FIG. 9(*b*), the focusing position of the first laser light L1 may be a position in the substrate 102.

[Operation and Effect]

With the laser processing apparatus 1 and the laser processing method described above, by irradiating the functional element layer 104 with the first laser light L1, the functional element layer 104 can be weakened and the weakened region J can be formed in the functional element layer 104. Therefore, by emitting the second laser light L2 after the emission of the first laser light L1, a crack C reaching the front surface 100*a* of the target 100 on the functional element layer 104 as half cut can be reliably formed along the line 105 using the weakened region J. The target 100 can be cut accurately.

In the laser processing apparatus 1 and the laser processing method, the pulse pitch of the first laser light L1 is shorter than the pulse pitch of the second laser light L2. In this case, by irradiating the functional element layer 104 with the first laser light L1, the weakened region J can be reliably formed in the functional element layer 104.

In the laser processing apparatus 1 and the laser processing method, the functional element layer 104 includes the protective film 104*a*, the low dielectric constant film 104*b*, and the metal layer 104*c*. In this case, since it is particularly difficult to form a half cut on the front surface 100*a* on the functional element layer 104 side, the above-mentioned action and effect capable of reliably forming the half cut are particularly effective.

In the laser processing apparatus 1 and the laser processing method, the focusing position of the first laser light L1 is the position in the functional element layer 104. In this case, by irradiating the functional element layer 104 with the first laser light L1, the weakened region J can be reliably formed in the functional element layer 104.

In the laser processing apparatus 1 and the laser processing method, the protective tape TP is attached to the front surface 100*a* of the target 100. The protective tape TP can protect the functional element layer 104 on the front surface 100*a* side of the target 100 and can suppress scattering of processing by-products that may be generated when the weakened region J is formed in the functional element layer 104.

In the laser processing apparatus 1 and the laser processing method, the first laser processing head 10A emits the first laser light L1 while moving along the line 105. The second laser processing head 10B emits the second laser light L2 while moving along the line 105 to follow the first laser processing head 10A. In this case, it is possible to efficiently achieve the formation of the weakened region J and the formation of the half cut using the weakened region J.

With the laser processing apparatus 1 and the laser processing method, by irradiating the functional element layer 104 with the first laser light L1, the functional element layer 104 can be weakened and the weakened region J can be formed in the functional element layer 104. Thus, with the second laser light L2 emitted, the target 100 can be accurately cut along the line 105 using the weakened region J, even when no half cut reaching the front surface 100*a* is formed along the line 105 for example.

The present embodiment further has the following operations and effects.

The laser processing head 10A has no light source, for outputting the laser light L1, provided in the housing 11. Thus, the housing 11 can be downsized. In the housing 11, the distance between the third wall portion 23 and the fourth wall portion 24 is shorter than the distance between the first wall portion 21 and the second wall portion 22, and the condensing unit 14 arranged on the sixth wall portion 26 is offset toward the fourth wall portion 24 in the Y direction. With this configuration, when the housing 11 moves along a direction orthogonal to the optical axis of the condensing unit 14, even if another configuration (the laser processing head 10B, for example) exists on the fourth wall portion 24 side, the condensing unit 14 can be brought near the other configuration. Therefore, the laser processing head 10A is suitable for moving the condensing unit 14 along the direction orthogonal to its optical axis.

In the laser processing head 10A, the entrance portion 12 is provided in the fifth wall portion 25 and is offset toward the fourth wall portion 24 in the Y direction. With this configuration, another configuration (the circuit unit 19 for example) can be arranged in a region, of a region in the housing 11, on the third wall portion 23 side with respect to the adjustment unit 13, or such a region can be used for the other like purposes. Thus, the region can be effectively used.

In the laser processing head 10A, the condensing unit 14 is offset toward the second wall portion 22 in the X direction.

With this configuration, when the housing 11 moves along a direction orthogonal to the optical axis of the condensing unit 14, for example, even if another configuration exists on the second wall portion 22 side, the condensing unit 14 can be brought near the other configuration.

In the laser processing head 10A, the entrance portion 12 is provided in the fifth wall portion 25 and is offset toward the second wall portion 22 in the X direction. With this configuration, another configuration (the measurement unit 16 and the monitoring unit 17 for example) can be arranged in a region, of a region in the housing 11, on the first wall portion 21 side with respect to the adjustment unit 13, or such a region can be used for the other like purposes. Thus, the region can be effectively used.

In the laser processing head 10A, the measurement unit 16 and the monitoring unit 17 are arranged in the region, of the region in the housing 11, on the first wall portion 21 side with respect to the adjustment unit 13. The circuit unit 19 is arranged in the region in the housing 11, on the third wall portion 23 side with respect to the adjustment unit 13. The dichroic mirror 15 is arranged between the adjustment unit 13 and the condensing unit 14 in the housing 11. With this configuration, the region inside the housing 11 can be effectively used. Furthermore, in the laser processing apparatus 1, processing can be performed based on a result of measuring the distance between the surface of the target 100 and the condensing unit 14. Furthermore, in the laser processing apparatus 1, processing can be performed based on a result of monitoring the surface of the target 100.

In the laser processing head 10A, the circuit unit 19 controls the driving unit 18 based on the signal output from the measurement unit 16. With this configuration, the position of the focusing point of the laser light L1 can be adjusted based on a result of measuring the distance between the surface of the target 100 and the condensing unit 14.

Furthermore, in the laser processing head 10A, the entrance portion 12 as well as the attenuator 31, the beam expander 32, and the mirror 33 of the adjustment unit 13 are arranged on the straight line A1 extending along the Z direction. Furthermore, the reflective spatial light modulator 34, the imaging optical system 35, and the condensing unit 14 of the adjustment unit 13 as well as the condensing unit 14 are arranged on the straight line A2 extending along the Z direction. With this configuration, the adjustment unit 13 including the attenuator 31, the beam expander 32, the reflective spatial light modulator 34, and the imaging optical system 35 can be compactly configured.

In the laser processing head 10A, the straight line A1 is positioned on the second wall portion 22 side with respect to the straight line A2. With this configuration, when other optical systems using the condensing unit 14 (the measurement unit 16 and the monitoring unit 17 for example) are configured in the region, of the region in the housing 11, on the first wall portion 21 side with respect to the adjustment unit 13, the degree of freedom in configuration of the other optical systems can be improved.

The above actions and effects are similarly provided by the laser processing head 10B.

In the laser processing apparatus 1, the condensing unit 14 of the laser processing head 10A is offset toward the laser processing head 10B in the housing 11 of the laser processing head 10A, and the condensing unit 14 of the laser processing head 10B is offset toward the laser processing head 10A in the housing 11 of the laser processing head 10B. With this configuration, when the pair of laser processing heads 10A and 10B move along the Y direction, the condensing unit 14 of the laser processing head 10A and the condensing unit 14 of the laser processing head 10B can be brought close to each other. Therefore, with the laser processing apparatus 1, the target 100 can be efficiently processed.

In the laser processing apparatus 1, the pair of attachment portions 65 and 66 respectively move along the Y direction and the Z direction. With this configuration, the target 100 can be processed more efficiently.

In the laser processing apparatus 1, the support portion 7 moves along each of the X direction and the Y direction, and rotates about the axis parallel to the Z direction. With this configuration, the target 100 can be processed more efficiently.

Modification Examples

Figure 10:
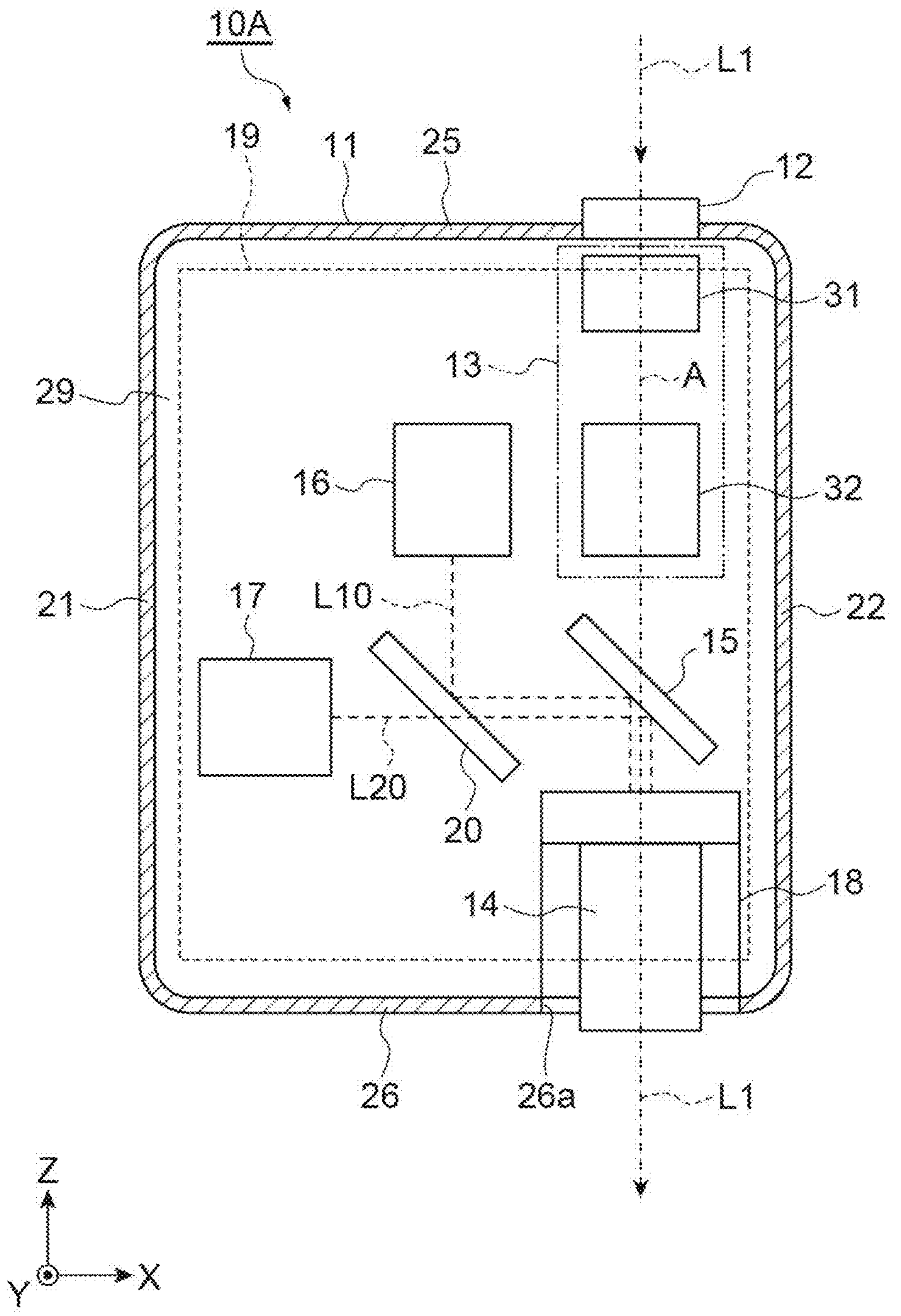
FIG. 10 is a diagram illustrating a configuration of an optical system of a laser processing head of a modification example.

One aspect of the present invention is not limited to the above-described embodiment. For example, as illustrated in FIG. 10, the entrance portion 12, the adjustment unit 13, and the condensing unit 14 may be arranged on a straight line A extending along the Z direction. With this configuration, the adjustment unit 13 can be configured compactly. In this case, the adjustment unit 13 may not include the reflective spatial light modulator 34 and the imaging optical system 35. Further, the adjustment unit 13 may include the attenuator 31 and the beam expander 32. With this configuration, the adjustment unit 13 including the attenuator 31 and the beam expander 32 can be compactly configured. The order of arrangement of the attenuator 31 and the beam expander 32 may be reversed.

The housing 11 may have any configuration to be attached to the attachment portion 65 (or the attachment portion 66) with at least one of the first wall portion 21, the second wall portion 22, the third wall portion 23, and the fifth wall portion 25 arranged on the attachment portion 65 (or the attachment portion 66) side of the laser processing apparatus 1. The condensing unit 14 may have any configuration as long as it is at least offset toward the fourth wall portion 24 in the Y direction. With such configurations, when the housing 11 moves along the Y direction, for example, even if another configuration exists on the fourth wall portion 24 side, the condensing unit 14 can be brought near the other configuration. When the housing 11 moves along the Z direction, the condensing unit 14 can be brought close to the target 100, for example.

The condensing unit 14 may be offset toward the first wall portion 21 in the X direction. With this configuration, when the housing 11 moves along a direction orthogonal to the optical axis of the condensing unit 14, even if another configuration exists on the first wall portion 21 side, for example, the condensing unit 14 can be brought near the other configuration. In this case, the entrance portion 12 may be offset toward the first wall portion 21 in the X direction. With this configuration, another configuration (the measurement unit 16 and the monitoring unit 17 for example) can be arranged in a region, of a region in the housing 11, on the second wall portion 22 side with respect to the adjustment unit 13, or such a region can be used for the other like purposes. Thus, the region can be effectively used.

Figure 11:
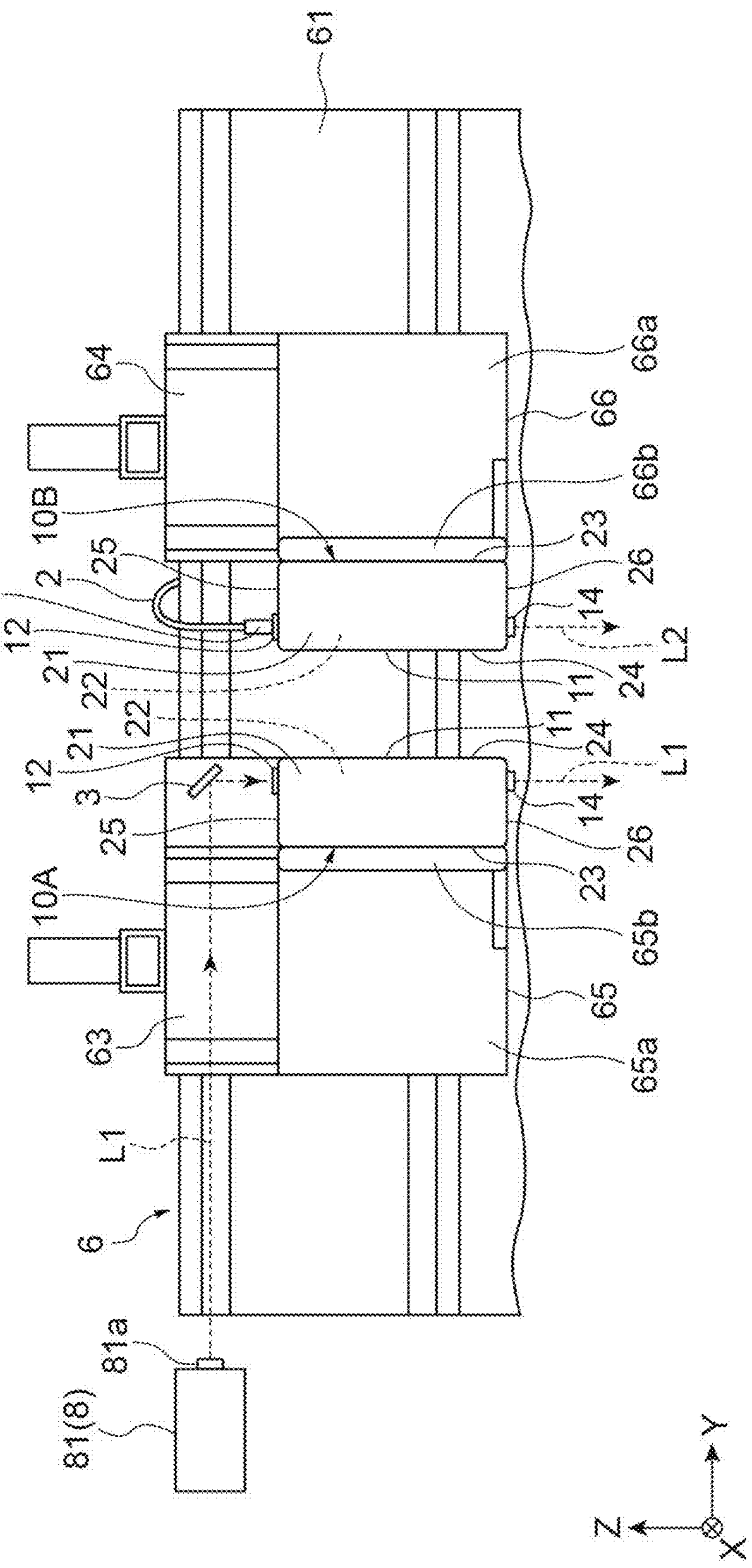
FIG. 11 is a front view of a portion of the laser processing apparatus of the modification example.

Further, at least one of the guiding of the laser light L1 from the emission portion 81*a* of the light source unit 8 to the entrance portion 12 of the laser processing head 10A and guiding of the laser light L2 from the emission portion 82*a* of the light source unit 8 to the entrance portion 12 of the laser processing head 10B may be implemented by a mirror. FIG. 11 is a front view of a portion of the laser processing apparatus 1 in which the laser light L1 is guided by a mirror.

In the configuration illustrated in FIG. 11, a mirror 3 that reflects the laser light L1 is attached to the moving portion 63 of the movement mechanism 6, to face the emission portion 81*a* of the light source unit 8 in the Y direction and face the entrance portion 12 of the laser processing head 10A in the Z direction.

With the configuration illustrated in FIG. 11, the state where the mirror 3 faces the emission portion 81*a* of the light source unit 8 in the Y direction is maintained, even when the moving portion 63 of the movement mechanism 6 moves along the Y direction. Furthermore, the state where the mirror 3 faces the entrance portion 12 of the laser processing head 10A in the Z direction is maintained, even when the attachment portion 65 of the movement mechanism 6 moves along the Z direction. Thus, the laser light L1 emitted from the emission portion 81*a* of the light source unit 8 can reliably enter the entrance portion 12 of the laser processing head 10A, regardless of the position of the laser processing head 10A. Furthermore, not optical fiber 2 needs to be used for guiding the laser light L1, and thus the laser light L1 emitted from the emission portion 81*a* of the light source unit 8 can reliably enter the entrance portion 12 of the laser processing head 10A, regardless of the wavelength of the laser light L1. Furthermore, a light source such as a high output ultrashort pulse laser, guiding for which using the optical fiber 2 is otherwise difficult, can be used.

Furthermore, with the configuration illustrated in FIG. 11, the mirror 3 may be attached to the moving portion 63 of the movement mechanism 6 to have at least one of angle and position adjustable. With this configuration, the laser light L1 emitted from the emission portion 81*a* of the light source unit 8 can reliably enter the entrance portion 12 of the laser processing head 10A.

Furthermore, the light source unit 8 may include a single light source. In this case, the light source unit 8 may be configured to emit a part of a laser light, output from one light source, from the emission portion 81*a* and emit the remaining part of the laser light from an emission portion 82*b*.

Furthermore, the laser processing apparatus 1 may include one laser processing head 10A. Also in the laser processing apparatus 1 including one laser processing head 10A, when the housing 11 moves along the Y direction orthogonal to the optical axis of the condensing unit 14, even if another configuration exists on the fourth wall portion 24 side, for example, the condensing unit 14 can be brought near the other configuration. Thus, also with the laser processing apparatus 1 including one laser processing head 10A, the target 100 can be efficiently processed. Furthermore, in the laser processing apparatus 1 including one laser processing head 10A, when the attachment portion 65 moves along the Z direction, the target 100 can be processed more efficiently. Furthermore, in the laser processing apparatus 1 provided with one laser processing head 10A, when the support portion 7 moves along the X direction and rotates about the axis parallel to the Z direction, the target 100 can be processed more efficiently.

Figure 12:
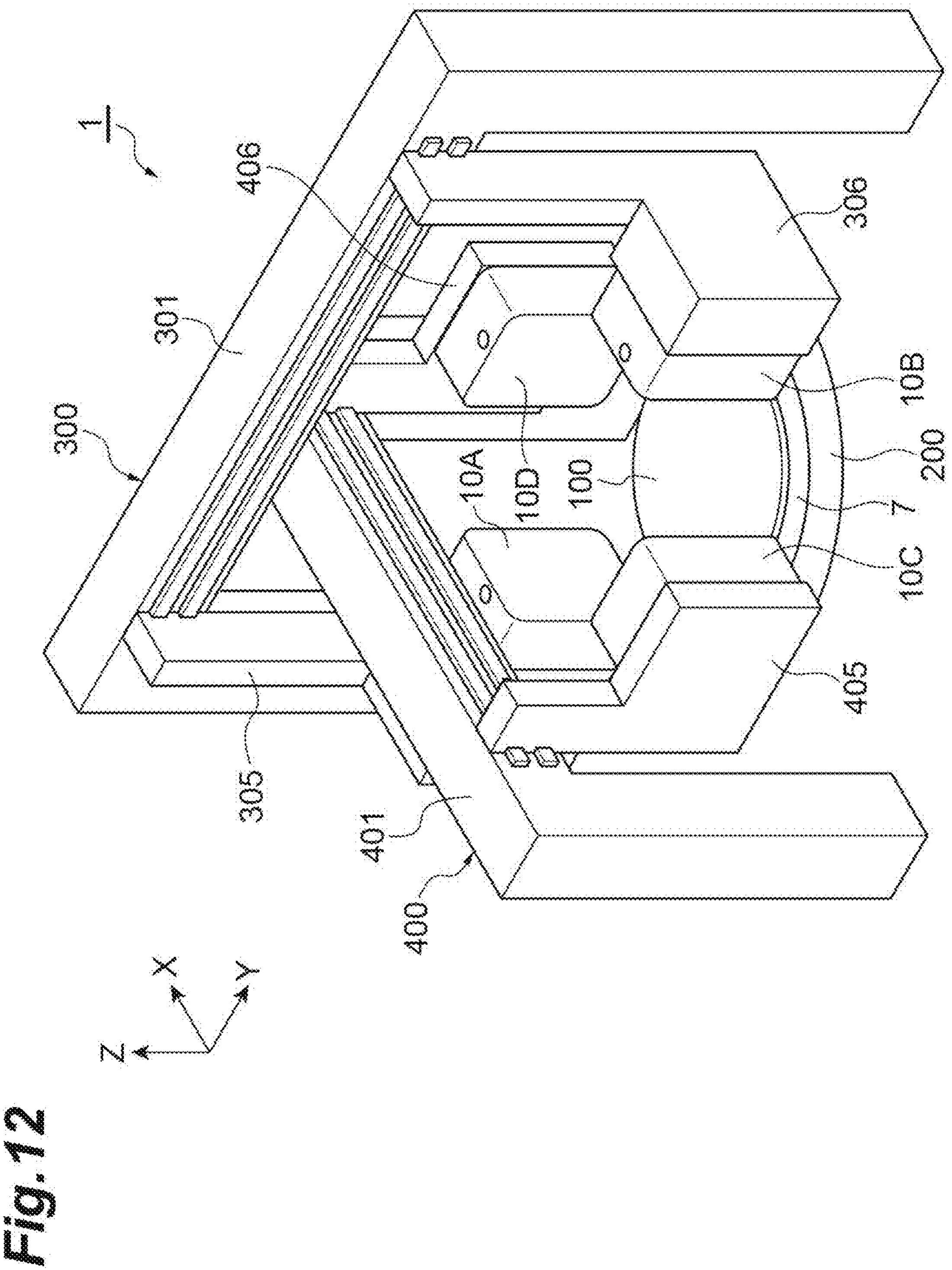
FIG. 12 is a perspective view of the laser processing apparatus of the modification example.

The laser processing apparatus 1 may include three or more laser processing heads. FIG. 12 is a perspective view of a laser processing apparatus 1 including two pairs of laser processing heads. The laser processing apparatus 1 illustrated in FIG. 12 includes a plurality of movement mechanisms 200, 300, and 400, the support portion 7, the pair of laser processing heads 10A and 10B, a pair of laser processing heads 10C and 10D, and a light source unit (not illustrated).

The movement mechanism 200 moves the support portion 7 along the each of the X direction, the Y direction, and the Z direction, and rotates the support portion 7 about an axis parallel to the Z direction.

The movement mechanism 300 includes a fixed portion 301 and a pair of attachment portions (a first attachment portion and a second attachment portion) 305 and 306. The fixed portion 301 is attached to a device frame (not illustrated). The pair of attachment portions 305 and 306 are each attached to a rail provided on the fixed portion 301, and can move in the Y direction independently from each other.

The movement mechanism 400 includes a fixed portion 401 and a pair of attachment portions (a first attachment portion and a second attachment portion) 405 and 406. The fixed portion 401 is attached to a device frame (not illustrated). The pair of attachment portions 405 and 406 are each attached to a rail provided on the fixed portion 401, and can move in the X direction independently from each other. The rail of the fixed portion 401 is arranged to three-dimensionally intersect with the rail of the fixed portion 301.

The laser processing head 10A is attached to the attachment portion 305 of the movement mechanism 300. The laser processing head 10A irradiates the target 100, supported by the support portion 7, with a laser light, while facing the support portion 7 in the Z direction. The laser light emitted from the laser processing head 10A is guided by the optical fiber 2 from the light source unit (not illustrated). The laser processing head 10B is attached to the attachment portion 306 of the movement mechanism 300. The laser processing head 10B irradiates the target 100, supported by the support portion 7, with a laser light, while facing the support portion 7 in the Z direction. The laser light emitted from the laser processing head 10B is guided by the optical fiber 2 from the light source unit (not illustrated).

The laser processing head 10C is attached to the attachment portion 405 of the movement mechanism 400. The laser processing head 10C irradiates the target 100, supported by the support portion 7, with a laser light, while facing the support portion 7 in the Z direction. The laser light emitted from the laser processing head 10C is guided by the optical fiber 2 from the light source unit (not illustrated). The laser processing head 10D is attached to the attachment portion 406 of the movement mechanism 400. The laser processing head 10D irradiates the target 100, supported by the support portion 7, with a laser light, while facing the support portion 7 in the Z direction. The laser light emitted from the laser processing head 10D is guided by the optical fiber 2 from the light source unit (not illustrated).

The configuration of the pair of laser processing heads 10A and 10B in the laser processing apparatus 1 illustrated in FIG. 12 is the same as the configuration of the pair of laser processing heads 10A and 10B in the laser processing apparatus 1 illustrated in FIG. 1. The configuration of the pair of laser processing heads 10C and 10D in the laser processing apparatus 1 illustrated in FIG. 12 is the same as the configuration of the pair of laser processing heads 10A and 10B as a result of rotating the pair of laser processing heads 10A and 10B, in the laser processing apparatus 1 illustrated in FIG. 1, by 90° about an axis parallel to the Z direction.

For example, the housing (first housing) 11 of the laser processing head 10C is attached to the attachment portion 65 with the fourth wall portion 24 positioned on the laser processing head 10D side with respect to the third wall portion 23, and with the sixth wall portion 26 positioned on the support portion 7 side with respect to the fifth wall portion 25. The condensing unit 14 of the laser processing head 10C is offset toward the fourth wall portion 24 (that is, toward the laser processing head 10D) in the Y direction.

The housing (second housing) 11 of the laser processing head 10D is attached to the attachment portion 66 with the fourth wall portion 24 positioned on the laser processing head 10C side with respect to the third wall portion 23, and with the sixth wall portion 26 positioned on the support portion 7 side with respect to the fifth wall portion 25. The condensing unit 14 of the laser processing head 10D is offset toward the fourth wall portion 24 (that is, toward the laser processing head 10C) in the Y direction.

With the above configuration, in the laser processing apparatus 1 illustrated in FIG. 12, when the pair of laser processing heads 10A and 10B each move along the Y direction, the condensing unit 14 of the laser processing head 10A and the condensing unit 14 of the laser processing head 10B can be brought close to each other. Furthermore, when the pair of laser processing heads 10C and 10D each move along the X direction, the condensing unit 14 of the laser processing head 10C and the condensing unit 14 of the laser processing head 10D can be brought close to each other.

The laser processing head and the laser processing apparatus according to one aspect of the present invention are not limited to those for forming the modified region in the target 100, and thus may be those for implementing other types of laser processing.

In the above-described embodiment, in the second step, the second laser light L2 is emitted into the target 100 to follow the first laser light L1 along the line 105, while the weakened region J is being formed in the first step, but this should not be construed in a limiting sense. In the second step, the second laser light L2 may be emitted into the target 100 to follow the first laser light L1 along the line 105, after the formation of the weakened region J has been completed in the first step (that is, after a timing at which the weakened region J is formed and at a different timing not overlapping with the timing).

In the above embodiment, the laser processing apparatus 1 includes the first and the second laser processing heads 10A and 10B, but may include only one of the first and the second laser processing heads 10A and 10B. In this case, one of the first and the second laser processing heads 10A and 10B emits the first and the second laser lights L1 and L2. In the above embodiment, the functional element layer 104 may include at least any of the protective film 104*a*, the low dielectric constant film 104*b*, and the metal layer 104*c*.

In the above-described embodiment, a configuration may be adopted in which one laser processing head is provided and a plurality of laser lights are emitted from the one laser processing head. In this case, a plurality of laser lights may be emitted simultaneously or may be emitted in multiple stages. In the above-described embodiment, a configuration may be adopted in which one laser processing head is provided and a single laser light is emitted from the one laser processing head. In this case, the laser light may be emitted in multiple stages.

The present invention can also be regarded as a laser processing apparatus, a modified region forming device, or a chip manufacturing device. The present invention can also be regarded as a laser processing method, a modified region forming method, or a chip manufacturing method. In the embodiment and the modification example described above, at least a part of the configurations of the embodiment and the modification example described above may be combined as appropriate.

In the embodiments described above, the first laser light L1 and the second laser light L2 may be a quasi-continuously oscillated wave (quasi-CW) laser light. Pseudo-continuously oscillated means an oscillation mode in which a pulse with a peak oscillates at a very high repetition frequency.

REFERENCE SIGNS LIST

10A first laser processing head
10B second laser processing head
100 target
100*a* front surface
100*b* back surface
104 functional element layer
104*a* protective film
104*b* low dielectric constant film
104*c* metal layer
105 line
C crack
J weakened region
L1 first laser light (pulsed laser light, first pulsed laser light)
L2 second laser light (pulsed laser light, second pulsed laser light)
TP protective tape

The invention claimed is:

1. A laser processing method comprising a laser light emitting step of emitting a pulsed laser light along a line from a back surface of a target comprising a substrate, wherein the laser light emitting step includes:

a first step of irradiating a functional element layer of the substrate that is made of a different material from the rest of the substrate and defines a front surface of the substrate with a first pulsed laser light along the line in a first focusing position located proximal to the front surface, to form a weakened material region in the functional element layer along the line by embrittling the material without removing the material; and a second step of emitting a second pulsed laser light into the substrate of the target to follow the first pulsed laser light along the line in a second focusing position located between the first focusing position and the back surface, wherein (i) the emitted second pulsed laser light causes formation of a crack that begins in a first intermediate portion of the substrate located at a depth between the front surface and the back surface of the substrate as defined by the second focusing position, (ii) the crack extends in a first direction to reach the front surface and also extends in a second direction different from the first direction to reach a second intermediate portion of the substrate located between the first intermediate portion and the back surface along the line in the target, and (iii) the crack only extends between the front surface and the second intermediate portion of the substrate leaving the substrate intact from the second intermediate portion to the back surface as a result of the second step of emitting the second pulsed laser light into the substrate, and the first pulsed laser light has a pulse width that is shorter than a pulse width of the second pulsed laser light.

2. The laser processing method according to claim 1, wherein a pulse pitch of the first pulsed laser light is shorter than a pulse pitch of the second pulsed laser light.

3. The laser processing method according to claim 1, wherein the functional element layer includes at least one of a protective film, a low dielectric constant film, and a metal layer.

4. The laser processing method according to claim 1, wherein in the first step, a focusing position of the first pulsed laser light is a position that is separated from the functional element layer on an opposite side of an incident side of the pulsed laser light, a position in the target, or a position in the functional element layer.

5. The laser processing method according to claim 1, wherein a protective tape or a protective substrate is attached to the front surface of the substrate.

6. The laser processing method according to claim 1, wherein in the first step, a first laser processing head moves along the line while emitting the first pulsed laser light, and in the second step, a second laser processing head moves along the line to follow the first laser processing head while emitting the second pulsed laser light.

* * * * *